United States Patent
Demaray et al.

(10) Patent No.: US 8,728,285 B2
(45) Date of Patent: May 20, 2014

(54) TRANSPARENT CONDUCTIVE OXIDES

(75) Inventors: Richard E. Demaray, Portola Valley, CA (US); Mukundan Narasimhan, San Jose, CA (US)

(73) Assignee: Demaray, LLC, Portola Valley, CA (US)

( * ) Notice: Subject to any disclaimer, the term of this patent is extended or adjusted under 35 U.S.C. 154(b) by 1444 days.

(21) Appl. No.: 10/850,968

(22) Filed: May 20, 2004

(65) Prior Publication Data

US 2005/0000794 A1   Jan. 6, 2005

Related U.S. Application Data

(60) Provisional application No. 60/473,379, filed on May 23, 2003.

(51) Int. Cl.
*C23C 14/34* (2006.01)

(52) U.S. Cl.
USPC ............................. 204/192.29; 204/192.26

(58) Field of Classification Search
USPC ............. 204/192.29, 192.15, 192.26, 192.27, 204/192.28
See application file for complete search history.

(56) References Cited

U.S. PATENT DOCUMENTS

| | | | |
|---|---|---|---|
| 712,316 A | 10/1902 | Loppe et al. | |
| 2,970,180 A | 1/1961 | Urry | |
| 3,309,302 A | 3/1967 | Heil | |
| 3,616,403 A | 10/1971 | Collins et al. | |
| 3,790,432 A | 2/1974 | Fletcher et al. | |
| 3,797,091 A | 3/1974 | Gavin | |
| 3,850,604 A | 11/1974 | Klein | |
| 3,939,008 A | 2/1976 | Longo et al. | |
| 4,006,070 A * | 2/1977 | King et al. | ............... 204/192.29 |
| 4,082,569 A | 4/1978 | Evans, Jr. | |
| 4,099,091 A | 7/1978 | Yamazoe et al. | |
| 4,111,523 A | 9/1978 | Kaminow et al. | |
| 4,127,424 A | 11/1978 | Ullery, Jr. | |
| 4,226,924 A | 10/1980 | Kimura et al. | |
| 4,283,216 A | 8/1981 | Brereton | |
| 4,318,938 A | 3/1982 | Barnett et al. | |

(Continued)

FOREIGN PATENT DOCUMENTS

| | | |
|---|---|---|
| CN | 1415124 | 4/2003 |
| CN | 1471181 A | 1/2004 |

(Continued)

OTHER PUBLICATIONS

U.S. Appl. No. 10/954,182.

(Continued)

*Primary Examiner* — Rodney McDonald
(74) *Attorney, Agent, or Firm* — Haynes and Boone, LLP

(57) ABSTRACT

A method of deposition of a transparent conductive film from a metallic target is presented. A method of forming a transparent conductive oxide film according to embodiments of the present invention include depositing the transparent conductive oxide film in a pulsed DC reactive ion process with substrate bias, and controlling at least one process parameter to affect at least one characteristic of the conductive oxide film. The resulting transparent oxide film, which in some embodiments can be an indium-tin oxide film, can exhibit a wide range of material properties depending on variations in process parameters. For example, varying the process parameters can result in a film with a wide range of resistive properties and surface smoothness of the film.

28 Claims, 9 Drawing Sheets

(56) References Cited

U.S. PATENT DOCUMENTS

| | | |
|---|---|---|
| 4,437,966 A | 3/1984 | Hope et al. |
| 4,442,144 A | 4/1984 | Pipkin |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,812,712 A | 3/1989 | Ohnishi et al. |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,141,603 A | 8/1992 | Dickey et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | Moré |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,258,252 A | 11/1993 | Sakai et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger |
| 5,360,686 A | 11/1994 | Peled et al. |
| 5,362,579 A | 11/1994 | Rossoll et al. |
| 5,362,672 A | 11/1994 | Ohmi et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A | 8/1995 | Hobson et al. |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,507,930 A * | 4/1996 | Yamashita et al. ........ 204/192.15 |
| 5,512,147 A | 4/1996 | Bates et al. |
| 5,512,387 A | 4/1996 | Ovshinsky |
| 5,512,389 A | 4/1996 | Dasgupta et al. |
| 5,515,387 A | 5/1996 | Smith |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,612,153 A | 3/1997 | Moulton et al. |
| 5,613,995 A | 3/1997 | Bhandarkar et al. |
| 5,616,933 A | 4/1997 | Li |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A | 8/1997 | Shimizu et al. |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,681,671 A * | 10/1997 | Orita et al. ................. 429/218.1 |

(56) References Cited

U.S. PATENT DOCUMENTS

| | | | |
|---|---|---|---|
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,718,813 A | 2/1998 | Drummond |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,761,234 A | 6/1998 | Craig et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,789,071 A | 8/1998 | Sproul et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A * | 11/1998 | Lantsman ............... 204/192.12 |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A * | 8/1999 | Sproul et al. ............ 204/192.13 |
| 5,948,215 A | 9/1999 | Lantsman |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Van Lerberghe |
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,972,516 A | 10/1999 | Kaneko et al. |
| 5,973,913 A | 10/1999 | McEwen et al. |
| 5,977,582 A | 11/1999 | Fleming et al. |
| 5,982,144 A | 11/1999 | Johnson et al. |
| 5,985,485 A | 11/1999 | Ovshinsky et al. |
| 6,000,603 A | 12/1999 | Koskenmaki et al. |
| 6,001,224 A | 12/1999 | Drummond |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz de Araujo et al. |
| 6,113,749 A | 9/2000 | Kok et al. |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,210,545 B1 | 4/2001 | Farooq et al. |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |
| 6,268,695 B1 | 7/2001 | Affinito |

(56) References Cited

U.S. PATENT DOCUMENTS

| | | |
|---|---|---|
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,293,688 B1 | 9/2001 | Deacon |
| 6,294,722 B1 | 9/2001 | Kondo et al. |
| 6,296,741 B1 | 10/2001 | Pinarbasi |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin et al. |
| 6,306,265 B1 | 10/2001 | Fu et al. |
| 6,312,274 B1 | 11/2001 | Lin |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greef et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,098 B1 | 4/2002 | Newcomb et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greef et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,466,771 B2 | 10/2002 | Wood, Jr. |
| 6,475,668 B1 | 11/2002 | Hosokawa et al. |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,495,726 B1 | 12/2002 | Kantam et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,549,688 B2 | 4/2003 | Bazylenko |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,570,325 B2 | 5/2003 | Graff et al. |
| 6,572,173 B2 | 6/2003 | Müller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,610,440 B1 | 8/2003 | LaFollette et al. |
| 6,615,614 B1 | 9/2003 | Makikawa et al. |
| 6,616,035 B2 | 9/2003 | Ehrensvärd et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Müllner |
| 6,639,578 B1 | 10/2003 | Comiskey et al. |
| 6,641,704 B2 | 11/2003 | Someno |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |

(56) References Cited

U.S. PATENT DOCUMENTS

| | | |
|---|---|---|
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,751,241 B2 | 6/2004 | Davis et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jenson et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,849,165 B2 * | 2/2005 | Kloppel et al. .......... 204/192.15 |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jenson |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,205,662 B2 | 4/2007 | Narasimhan et al. |
| 7,218,809 B2 | 5/2007 | Zhou et al. |
| 7,220,517 B2 | 5/2007 | Park et al. |
| 7,230,321 B2 | 6/2007 | McCain |
| 7,238,628 B2 | 7/2007 | Demaray et al. |
| 7,247,408 B2 | 7/2007 | Skotheim et al. |
| 7,253,494 B2 | 8/2007 | Mino et al. |
| 7,262,131 B2 | 8/2007 | Narasimhan et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,340,124 B2 | 3/2008 | Patel et al. |
| 7,345,647 B1 | 3/2008 | Rodenbeck |
| 7,348,099 B2 | 3/2008 | Mukai et al. |
| 7,378,356 B2 | 5/2008 | Zhang et al. |
| 7,381,657 B2 | 6/2008 | Zhang et al. |
| 7,389,580 B2 | 6/2008 | Jenson et al. |
| 7,400,253 B2 | 7/2008 | Cohen |
| 7,404,877 B2 | 7/2008 | Demaray et al. |
| 7,410,730 B2 | 8/2008 | Bates |
| 7,413,998 B2 | 8/2008 | Zhang et al. |
| RE40,531 E | 10/2008 | Graff et al. |
| 7,468,221 B2 | 12/2008 | LaFollette et al. |
| 7,469,558 B2 | 12/2008 | Demaray et al. |
| 7,494,742 B2 | 2/2009 | Tarnowski et al. |
| 7,544,276 B2 | 6/2009 | Zhang et al. |
| 7,670,724 B1 | 3/2010 | Chan et al. |
| 7,826,702 B2 | 11/2010 | Dawes |
| 7,838,133 B2 | 11/2010 | Zhang et al. |
| 8,045,832 B2 | 10/2011 | Pan et al. |
| 8,076,005 B2 | 12/2011 | Demaray et al. |
| 8,105,466 B2 * | 1/2012 | Zhang et al. ............. 204/192.13 |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0050223 A1 | 12/2001 | Gopalraja et al. |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson et al. |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0028555 A1 | 3/2002 | Boyd et al. |

(56) References Cited

U.S. PATENT DOCUMENTS

| | | |
|---|---|---|
| 2002/0033330 A1 | 3/2002 | Demaray et al. |
| 2002/0037756 A1 | 3/2002 | Jacobs et al. |
| 2002/0048941 A1 | 4/2002 | Kato et al. |
| 2002/0066539 A1 | 6/2002 | Muller |
| 2002/0067615 A1 | 6/2002 | Muller |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0108649 A1 | 8/2002 | Fujimori et al. |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0007718 A1 | 1/2003 | Bazylenko |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063629 A1 | 4/2003 | Davis et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0152829 A1 | 8/2003 | Zhang et al. |
| 2003/0162094 A1 | 8/2003 | Lee et al. |
| 2003/0173207 A1* | 9/2003 | Zhang et al. ............ 204/192.12 |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2003/0234835 A1 | 12/2003 | Torii et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0208454 A1 | 10/2004 | Montgomery et al. |
| 2004/0209159 A1 | 10/2004 | Lee et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0105853 A1 | 5/2005 | Liu et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0225839 A1 | 10/2005 | Patel et al. |
| 2005/0239917 A1 | 10/2005 | Nelson et al. |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0134522 A1 | 6/2006 | Zhang et al. |
| 2006/0155545 A1 | 7/2006 | Jayne |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0172681 A1 | 7/2007 | Demaray et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0224951 A1 | 9/2007 | Gilb et al. |
| 2007/0263676 A1 | 11/2007 | Beukema et al. |
| 2007/0264564 A1 | 11/2007 | Johnson et al. |
| 2007/0278653 A1 | 12/2007 | Brunnbauer et al. |

(56) References Cited

U.S. PATENT DOCUMENTS

| | | |
|---|---|---|
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0107376 A1 | 5/2008 | Patel et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0286651 A1 | 11/2008 | Neudecker et al. |
| 2009/0181303 A1 | 7/2009 | Neudecker et al. |
| 2010/0032001 A1 | 2/2010 | Brantner |
| 2010/0086853 A1 | 4/2010 | Venkatachalam et al. |

FOREIGN PATENT DOCUMENTS

| | | |
|---|---|---|
| CN | 1532984 | 9/2004 |
| CN | 101073171 B | 9/2010 |
| CN | 1756856 B | 10/2011 |
| CN | 1826423 B | 11/2011 |
| CN | 101511493 B | 5/2012 |
| CN | 101931097 B | 11/2012 |
| DE | 10 2005 014 4 | 9/2006 |
| DE | 10 2006 054 3 | 11/2006 |
| DE | 10 2008 016 6 | 10/2008 |
| DE | 10 2007 030 6 | 1/2009 |
| EP | 0 510 883 A2 | 10/1992 |
| EP | 0 652 308 A2 | 10/1994 |
| EP | 0 639 655 A1 | 2/1995 |
| EP | 0 652 308 A2 | 5/1995 |
| EP | 0 820 088 A2 | 1/1998 |
| EP | 0 867 985 B1 | 9/1998 |
| EP | 1 068 899 A1 | 1/2001 |
| EP | 1068899 A1 | 1/2001 |
| EP | 0 867 985 B1 | 2/2001 |
| EP | 1 092 689 A1 | 4/2001 |
| EP | 1 189 080 A2 | 3/2002 |
| EP | 1 713 024 | 10/2006 |
| EP | 1825545 B1 | 11/2009 |
| EP | 1597408 B1 | 12/2012 |
| EP | 1633902 B1 | 12/2012 |
| FR | 2 861 218 | 4/2005 |
| JP | 55-009305 | 1/1980 |
| JP | 56-156675 | 12/1981 |
| JP | 60-068558 | 4/1985 |
| JP | 61-60803 | 3/1986 |
| JP | 62-267944 | 11/1987 |
| JP | 62-287071 | 12/1987 |
| JP | 2-054764 A2 | 2/1990 |
| JP | 2-230662 | 9/1990 |
| JP | 4-058456 | 2/1992 |
| JP | 4-072049 | 3/1992 |
| JP | 6-010127 | 1/1994 |
| JP | 6-100333 | 12/1994 |
| JP | 7-233469 A | 5/1995 |
| JP | 7-224379 A | 8/1995 |
| JP | 7-233469 | 9/1995 |
| JP | 09-0249962 | 9/1997 |
| JP | 09-249962 | 9/1997 |
| JP | 11-204088 | 7/1999 |
| JP | 2000-144435 | 5/2000 |
| JP | 2000-188099 | 7/2000 |
| JP | 2000-268867 | 9/2000 |
| JP | 2001-259494 | 9/2001 |
| JP | 2001-297764 | 10/2001 |
| JP | 2001-328198 | 11/2001 |
| JP | 2002-344115 | 11/2002 |
| JP | 2003-017040 | 1/2003 |
| JP | 2003-073824 | 3/2003 |
| JP | 2003-234100 | 8/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | 2004-273436 | 9/2004 |
| JP | 2004-335192 | 11/2004 |
| JP | 2005-256101 | 9/2005 |
| JP | 2002-203562 | 7/2012 |
| JP | 5095412 B2 | 12/2012 |
| KR | 2002-0007881 | 1/2002 |
| KR | 2002-0017790 | 3/2002 |
| KR | 2002-26187 | 4/2002 |
| KR | 2002-0029813 | 4/2002 |
| KR | 2002-0038917 | 5/2002 |
| KR | 2003-0033913 | 5/2003 |
| KR | 2003-0042288 | 5/2003 |
| KR | 2003-0085252 | 11/2003 |
| KR | 10-1021536 B1 | 3/2011 |
| RU | 2241281 | 11/2004 |
| TW | 478162 B | 3/2002 |
| WO | WO 95/13629 | 5/1995 |
| WO | WO 96/23085 | 8/1996 |
| WO | WO 96/23217 | 8/1996 |
| WO | WO 97/27344 | 7/1997 |
| WO | WO 97/35044 | 9/1997 |
| WO | WO 98/47196 | 10/1998 |
| WO | WO 99/43034 | 8/1999 |
| WO | WO 99/57770 | 11/1999 |
| WO | WO 00/21898 | 4/2000 |
| WO | WO 00/22742 | 4/2000 |
| WO | WO 00/28607 | 5/2000 |
| WO | WO 00/36665 | 6/2000 |
| WO | WO 00/60682 | 10/2000 |
| WO | WO 00/60689 | 10/2000 |
| WO | WO 00/62365 | 10/2000 |
| WO | WO 01/01507 | 1/2001 |
| WO | WO 01/17052 | 3/2001 |
| WO | WO 01/24303 | 4/2001 |
| WO | WO 01/33651 | 5/2001 |
| WO | WO 01/39305 | 5/2001 |
| WO | WO 01/73864 | 10/2001 |
| WO | WO 01/73865 | 10/2001 |
| WO | WO 01/73866 | 10/2001 |
| WO | WO 01/73868 | 10/2001 |
| WO | WO 01/73870 | 10/2001 |
| WO | WO 01/73883 | 10/2001 |
| WO | WO 01/73957 | 10/2001 |
| WO | WO 01/82297 A1 | 11/2001 |
| WO | WO 01/82390 | 11/2001 |
| WO | WO 01/86731 A1 * | 11/2001 |
| WO | WO 02/12932 | 2/2002 |
| WO | WO 02/42516 | 5/2002 |
| WO | WO 02/47187 | 6/2002 |
| WO | WO 02/071506 | 9/2002 |
| WO | WO 02/101857 | 12/2002 |
| WO | WO 03/003485 | 1/2003 |
| WO | WO 03/005477 | 1/2003 |
| WO | WO 03/026039 | 3/2003 |
| WO | WO 03/036670 | 5/2003 |
| WO | WO 03/069714 | 8/2003 |
| WO | WO 03/080325 | 10/2003 |
| WO | WO 03/083166 | 10/2003 |
| WO | WO 2004/012283 | 2/2004 |
| WO | WO 2004/021532 A1 | 3/2004 |
| WO | WO 2004/061887 | 7/2004 |
| WO | WO 2004/077519 A2 | 9/2004 |
| WO | WO 2004/086550 | 10/2004 |
| WO | WO 2004/106581 A2 | 12/2004 |
| WO | WO 2004/106582 A2 | 12/2004 |
| WO | WO 2005/008828 | 1/2005 |
| WO | WO 2005/013394 | 2/2005 |
| WO | WO 2005/024091 A1 | 3/2005 |
| WO | WO 2005/038957 | 4/2005 |
| WO | WO 2005/067645 | 7/2005 |
| WO | WO 2005/085138 | 9/2005 |
| WO | WO 2005/091405 | 9/2005 |
| WO | WO 2006/063308 A2 | 6/2006 |
| WO | WO 2006/138362 | 12/2006 |
| WO | WO 2007/016781 | 2/2007 |
| WO | WO 2007/027535 | 3/2007 |

(56) References Cited

FOREIGN PATENT DOCUMENTS

| WO | WO 2007/027535 A2 | 3/2007 |
|---|---|---|
| WO | WO 2007/095604 | 8/2007 |
| WO | WO 2008/036731 | 3/2008 |

OTHER PUBLICATIONS

Affinito et al., "PML/oxide/PML Barrier Layer Performance Differences Arising from Use of UV or Electron Beam Polymerization of the PML Layers," *Thin Solid Films* 308-309 pp. 19-25 (1997).
Affinito et al., "Polymer-Oxide Transparent Barrier Layers," Society of Vacuum Coaters, 39th Annual Technical Conference Proceedings, May 5-10, 1996, Philadelphia, PA, pp. 392-397 (May 1996).
Alder, T. et al., "High-Efficiency Fiber-to-Chip Coupling Using Low-Loss Tapered Single-Mode Fiber," *IEEE Photonics Technology Letters*, 12(8):1016-1018 (2000).
Almeida, Vilson R. et al., "Nanotaper for compact mode conversion," *Optics Letters*, 28(15):1302-1304 (2003).
Asghari et al., "ASOC—A Manufacturing Integrated Optics Technology," Part of the SPIE Conference on Integrated Optics Devices III, vol. 3620, pp. 252-262 (Jan. 1999).
Barbier et al, "Amplifying Four-Wavelength Combiner, Based on Erbium/Etterbium-Doped Waveguide Amplifiers and Integrated Splitters", *IEEE Photonics Technology Lettters*, vol. 9, pp. 315-317, 4 pages. (1997).
Barbier, Denis, "Performances and potentioal applications of erbium doped planar waveguide amplifiers and lasers," GeeO, pp. 58-63 (date unknown).
Beach R.J., "Theory and optimization of lens ducts," *Applied Optics*, 35:12:2005-2015 (Apr. 1996).
Belkind et al., "Using pulsed direct current power for reactive sputtering of $Al_2O_3$," *J. Vac. Sci. Technol*. A 17(4), pp. 1934-1940 (Jul. 1999).
Bestwick, T., "ASOC silicon integrated optics technology," Part of the SPIE Conferences on Photonics Packaging and Integration, SPIE vol. 3631, pp. 182-190 (Jan. 1999).
Borsella et al., "Structural incorporation of silver insoda-lime glass by the ion-exchange process: a photoluminescence spectroscopy study", *Applied Physics* A 71, pp. 125-132 (2000).
Byer et al., "Nonlinear Optics and Solid-state Lasers," *IEEE Journal on Selected Topics in Quantum Electronics*, vol. 6, No. 6, pp. 921-929 (Nov. 2000).
Chang, C.Y. (edited by), "ULSI Technology," The McGraw-Hill Companies, Inc., New York, 1996, Chapter 4, pp. 169-170, 226-231 (1996).
Choi et al., "Er-Al-codoped silicate planar light waveguide-type amplifier fabricated by radio-frequency sputtering," *Optics Letters*, vol. 25, No. 4, pp. 263-265 (Feb. 15, 2000).
Cooksey et al. "Predicting Permeability & Transmission Rate for Multilayer Materials," *Foodtechnology*, vol. 53, No. 9, Sep. 1999, pp. 60-63.
Delavaux et al., "Integrated optics erbium ytterbium amplifier system in 10 Gb/s fiber transmission experiment", 22nd European Conference on Optical Communication—ECOC' 96, Oslo, 4 pages (1996).
Distiributed Energy Resources: Fuel Cells, Projects, http://www.eere.energy.gov/der/fuel_cells/projects.html (2003).
DuPont Teijin Films, Mylar 200 SBL 300, Product Information (2000).
Electrometals Technologies Limited, Financial Report for the year 2002, Corporate Directory, Chairman's Review, Review of Operations (2002).
E-Tek website: FAQ, Inside E-Tek, E-Tek News, Products; http://www.etek-inc.com/ (2003).
Flytzanis et al, "nonlinear Optics in Composite Materials," E. Wolf, Progress in Optics XXIX (c) Elsevier Scince Publishers B.V., pp. 323-425 (1991).
Frazao et al., "EDFA Gain Flattening Using Long-Period Fibre Gratings Based on the Electric Arc Technique," (date unknown).

Fujii et al, "1.54 mm photoluminescence of $Er^{3+}$ doped into $SiO_2$ films containing Si nanocrystals: Evidence for energy transfer from Si nanocrystals for $Er^{3+}$", *Appl. Phys. Lett*. 71 (9), pp. 1198-1200 (1997).
Garcia, C. "Size Dependence of Lifetime and Absorption Cross Section of Si Nanocrystals Embedded in $SiO_2$," Appl. Phys. Lett., vol. 82, No. 10, pp. 1595-1597 (2003).
Han, Hak-Seung et al. "Optical Gain at 1.54 m in Erbium-Doped Silicon Nanocluster Sensitized Waveguide," Appl. Phys. Lett., vol. 79, No. 27, pp. 4568-4570 (2001).
Hayakawa et al, "Field enhancement effect of small Ag particles on the fluorescence from $Eu^{3+}$-doped $SiO_2$ glass", Applied Physics Letters, vol. 74, No. 11, pp. 1513-1515 (1999).
Hayakawa et al., "Enhanced fluorescence from $Eu^{3+}$-owing to surface plasma oscillation of silver particles in glass", Journal of Non-Crystalline Solids 259, pp. 16-22 (1999).
Hehlen et al. "Spectroscopic Properties of $Er^{3+}$ and $Yb^{3+}$-doped Soda-Lime Silicate and Aluminosilicate Glasses," Physical Review B, vol. 56, No. 15, pp. 9302-9318, (1997).
Hehlen et al. "Uniform Upconversion in High-Concentration $Er^{3+}$-doped Soda Lime Silicate and Aluminosilicate Glasses," Optics Letters, vol. 22, No. 11, pp. 772-774 (1997).
Horst et al., "Compact, Tunable Optical Devices in Silicon-Oxynitride Wave Guide Technology," IBM Research Division, 3 pages (1999).
Hubner, J. and Guldberg-Kjaer, S., "Planar Er-and Yb-Doped Amplifiers and Lasers," COM Technical University of Denmark, 10.sup.th European Conf. On Integrated Optics, Session WeB2, pp. 71-74 (2001).
Itoh, M. et al., "Large reduction of singlemode-fibre coupling loss in 1.5% delta planar lightwave circuits using spot-size converters," *Electronics Letters*, 38(2):72-74 (2002).
Jackson et al. "An Accurate Compact EDFA Model," Dept. of Electrical and Computer Engineering, University of BC (date unknown).
Johnson, J.E. et al., "Monolithically Integrated Semiconductor Optical Amplifier and Electroabsorption Modulator with Dual-Waveguide Spot-Size Converter Input," *IEEE Journal of Selected Topics in Quantum Electronics*, 6(1):19-25 (2000).
Jonsson L.B. et al. "Frequency response in pulsed DC reactive sputtering processes," *Thin Solid Films*, 365:43-48 (2000).
Kato et al., "Recent progress on PLC hybrid integration," Part of the SPIE Conference on Optoelectric Integrated Circuits III, SPIE. vol. 3631, pp. 28-36 (Jan. 1999).
Kato, Kuniharu et al., "PLC Hybrid Integration Technology and Its Application to Photonic Components," *IEEE Journal of Selected Topics in Quantum Electronics*, 6(1):4-13 (2000).
Kelly et al., "Reactive pulsed magnetron sputtering process for alumina films," *J. Vac. Sci. Technol*. A 18(6), pp. 2890-2896 (Nov. 2000).
Kelly et al., "Control of the structure and properties of aluminum oxide coatings deposited by pulsed magnetron sputtering," *J. Vac. Sci. Technol*. A 17(3), pp. 945-953 (May 1999).
Kik, P.G. et al. "Gain Limiting Processes in Er-doped Si Nanocrystal Waveguides in $SiO_2$," J. Appl. Phys., vol. 91, No. 1, Jan. 1, pp. 534-536 (2002).
Kim et al., "Frequency-dependent pulsed direct current magnetron sputtering of titanium oxide films,"*J. Vac. Sci. Technol. A*, vol. 19(2) pp. 429-434 (Mar./Apr. 2001).
Ladouceur, F. et al., "Effect of side wall roughness in buried channel waveguides," IEEE Proc., vol. 141, pp. 242-248 (Aug. 1994).
Ladouceur, F. et al., "8.8 Evaluation of Results", *Silica-based Buried Channel Waveguides and Devices.*, Chapman & Hall, London, pp. 98-99 (1996).
Lamb, William B., "Designing Nonfoil Containing Skins for VIP Applications," DuPont VIA Symposium Presentation (1999).
Lamb, William et al. "Designing Non-Foil Containing Skins for Vacuum InsulationPanel (VIP) Applications," Vuoto, vol. XXVIII, No. 1-2—Gennaio-Giugno 1999, pp. 55-58 (1999).
Lange et al, "High Gain Ultra-Short Length Phosphate glass Erbium-Doped Fiber Amplifier Material", OSA Optical Fiber Communications (OFC) 3 pages (2002).
Laporta et al, "Diode-pumped cw bulk Er: Yb: glass laser", *1952 Optics Letters*, vol. 16, No. 24, 6 pages (1991).

(56) References Cited

OTHER PUBLICATIONS

Laurent-Lund, C. et al., "PECVD Grown Multiple Core Planar Waveguides with Extremely Low Interface Reflections and Losses," IEEE Photonics Technology Letters vol. 10, No. 10, pp. 1431-1433 (Oct. 1998).
Lee, Kevin K. Desmond R. Lim, Hsin-Chiao Luan, Anuradha Agarwal, James Foresi and Lionel C. Kimerling, Effect of size and roughness on light transmission in a S/SiO.sub.2 waveguide: Experiments and model, Department of Materials Science and Engineering, Massachusetts Institute of Technology, (2000).
Love, J.D. et al., "Quantifying Loss Minimisation in Single-Mode Fibre Tapers," *Electronics Letters*, 22(17):912-914 (1986).
Marques, P.V.S. et al., "Planar Silica-on-Silicon Waveguide Lasers Based in Two Layer Core Devices," 10.sup.th European Conference on Integrated Optics, Session WeB2, pp. 79-82 (2001).
Meijerink et al, Luminescence of $AG^+$ in Crystalline and Glassy $SrB_4O_7$, Journal of Physics and Chemistry of Solids, vol. 54, No. 8, pp. 901-906, (1993).
Mesnaoui et al, "Spectroscopic properties of $AG^+$ ions in phospage glasses of $NaPO_3$-$AgPO_3$ system", European Journal of Solid State and Inorganic Chemistry, vol. 29, pp. 1001-1013, 14 pages (1992).
Mitomu, O. et al., Design of a Single-Mode Tapered Waveguide for Low-Loss Chip-to-Fiber Coupling,: *IEEE Journal of Quantum Electronics*, 30(8):1787-1793 (1994).
Ohkubo et al., "Polarization-Insensitive Arrayed-Waveguide Grating Using Pure Si)2 Cladding," Fifth Optoelectronics and Communication Conference (OECC 2000) Technical Digest, 2 pages (Jul. 2000).
Ohtsuki et al., "Gain Characteristics of a high concentration $Er^{3+}$-doped phosphate glass waveguide", J. Appl. Phys. 78(6), Physics, pp. 3617-3621 (1995).
Ono et al., "Design of a Low-loss Y-branch Optical Waveguide," Fifth Optoelectronic and Communications Conference (OECC 2000) Technical Digest, 2 pages (Jul. 2000).
Padmini et al. "Realization of High Tunability Barium Strontium Titanate Thin Films by RF Magnetron Sputtering," College of Engineering, University of California, Santa Barbara (date unknown).
Pan et al., "Planar Er3+-doped aluminosilicate waveguide amplifier with more than 10 dB gain across C-band," Optical Society of America, 3 pages (2000).
Peters et al., "Formation mechanism of silver nanocrystals made by ion irradiation of $Na^+$—$Ag^+$ ion-exchanged sodalime silicate glass", Nuclear Instruments and Methods in Physics Research B 168, pp. 237-244, (2000).
Rajarajan, M. et al., "Numerical Study of Spot-Zise Expanders for an Efficient OEIC to SMF Coupling," *IEEE Photonics Technology Letters*, 10(8):1082-1084, (1998).
Ramaswamy et al., "Ion-Exchanged Glass Waveguides: A Review", Journal of Lightwave Technology, vol. 6, No. 6, pp. 984-1001, (1988).
Roberts et al., "The Photoluminescence of Erbium-doped Silicon Monoxide," Department of Electronics and Computer Science, 7 pages (Jun. 1996).
Schermer, R. et al., "Investigation of Mesa Dielectric Waveguides,", Proceedings of the OSA Integrated Photonics Research Topical Meeting and Exhibit, Paper No. IWB3 (Jun. 11, 2001).
Schiller et al. "PVD Coating of Plastic Webs and Sheets with High Rates on Large Areas," European Materials Research Society 1999 Spring Meeting, Jun. 1-4, 1999, Strasbourg, France (1999).
Second International Symposium of Polymer Surface Modification: Relevance to Adhesion, Preliminary Program.(1999).
Sewell, P. et al., "Rib Waveguide Spot-Size Transformers: Modal Properties," *Journal of Lightwave Technology*, 17(5):848-856 (1999).
Shaw et al. "Use of Vapor Deposited Acrlate Coatings to Improve the Barrier Properties of MetallizedFilm," Society of Vacuum Coaters 505/856-7168, 37th Annual Technical Conference Proceedings pp. 240-244 (1994).
Shin et al. "Dielectric and Electrical Properties of Sputter Grown $(Ba,Sr)TiO_3$ Thin Films," J. Appl. Phys., vol. 86, No. 1, pp. 506-513 (1991).

Shmulovich et al., "Recent progress in Erbium-doped waveguide amplifiers," Bell Laboratories, 3 pages (1999).
Slooff et al, "Optical properties of Erbium-doped organic polydentate cage complexes", J. Appl. Phys. 83, pp. 497-503 (1998).
Smith, R.E., "Reduced Coupling Loss Using a Tapered-Rib Adiabatic-Following Fiber Coupler," *IEEE Photonics Technology Letters*, 8(8):1052-1054, (1996).
Strohhofr, et al. "Energy transfer to $Er^{3+}$ in Ag ion-exchanged glass", FOM Institute for Atomic and Molecular Physics, 10 pages (date unknown).
Sugiyama et al., "Gas Permeation Through the Pinholes of Plastic Film Laminated with Aluminium Foil,"Vuoto, vol. XXVIII, N. 1-2—Gennaio-Guigno (1999).
Tervonen, A., "Challenges and opportunities for integrated optics in optical networks," Part of the SPIE Conference in Integrated Optics Devices III, SPIE vol. 3620, pp. 2-11 (Jan. 1999).
Ting et al., "Study of planarized sputter-deposited SiO2," J. Vac. Sci. Technol., 15(3) pp. 1105-1112 (May/Jun. 1978).
Treichel et al., "The influence of pulsed magnetron sputtering on topography and crystallinity of TiO2 films on glass," *Space and Coatings Technology*, vol. 123, pp. 268-272 (2000).
Van Dover, R.B. "Amorphous Lanthanide-Doped $TiO_x$ Dielectric Films," Appl. Phys. Lett., vol. 74, No. 20, pp. 3041-3043 (1999).
Viljanen et al, "Planar Optical Coupling Elements for Multimode Fibers with Two-Step Ion Migration Process", Applied Physics, 24, No. 1, pp. 61-63 (1981).
Villegas et al, "Optical spectroscopy of a soda lime glass exchanged with silver", Physics and Chemistry of Glasses 37(6), pp. 248-253 (1996).
Westlinder et al. "Simulation and Dielectric Characterization of Reactive dc Magnetron Cosputtered $(Ta_2O_5)_{1-x}(TiO_2)_x$ Thin Films," J. Vac. Sci. Technol. B, vol. 20, No. 3, pp. 855-861, (2002).
Wilkes, Kenneth T. "Gas Permeation Through Vacuum Barrier Films and its Effect on VIP Thermal Performance," Vacuum Insulation Panel Symposium, Baltimore, Maryland (1999).
Yanagawa, H. et al., "Index-and-Dimensional Taper and Its Application to Photonic Devices," *Journal of Lightwave Technology*, 10(5):587-591 (1992).
Yoshikawa, K. et al., "Spray formed aluminium alloys for sputtering targets," Power Metallurgy, vol. 43, No. 3 (2000).
Zhang, Hongmei et al. "High Dielectric Strength, High k $TiO_2$ Films by Pulsed DC, Reactive Sputter Deposition," (2001).
Office Action issued on Nov. 28, 2001 in U.S. Appl. No. 6,506,289.
Response to Office Action filed on Feb. 20, 2002 in U.S. Appl. No. 6,506,289.
Office Action issued on Apr. 17, 2002 in U.S. Appl. No. 6,506,289.
Response to Office Action filed on Jul. 17, 2002 in U.S. Appl. No. 6,506,289.
Office Action issued on May 2, 2002 in U.S. Patent No. 6,533,907.
Response to Office Action filed on Sep. 3, 2002 in U.S. Patent No. 6,533,907.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
International Search Report issued on Nov. 21, 2003 in PCT/US03/24809.
International Search Report issued on Oct. 11, 2004 in PCT/US2004/005531.
Written Opinion issued on Oct. 11, 2004 in PCT/US2004/005531.
International Search Report issued on Jan. 17, 2005, in PCT/US2004/014523.
Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

(56) References Cited

OTHER PUBLICATIONS

Scholl, R., "Power Supplies for Pulsed Plasma Technologies: State-Of-The-Art and Outlook," Advances Energy Industries, Inc., pp. 1-8 (1999).
Scholl, R., "Power Systems for Reactive Sputtering of Insulating Films," Advances Energy Industries, Inc., pp. 1-8 (Aug. 2001).
Office Action dated Dec. 1, 2006, in U.S. Appl. No. 10/291,179.
Response to Office Action and Terminal Disclaimer dated Mar. 1, 2007, in U.S. Appl. No. 10/291,179.
Response to Office Action dated Feb. 6, 2007, in U.S. Appl. No. 10/101,863.
Response to Office Action dated Dec. 6, 2006, in U.S. Appl. No. 10/954,182.
Office Action dated Mar. 14, 2007, in U.S. Appl. No. 10/954,182.
Response to Office Action dated Mar. 30, 2007, U.S. Appl. No. 10/954,182.
Supplemental Preliminary Amendment dated Feb. 6, 2007, in U.S. Appl. No. 11/228,834.
Supplemental Preliminary Amendment dated Feb. 6, 2007, in U.S. Appl. No. 11/191,643.
Notice of Allowance dated Feb. 21, 2007, in U.S. Appl. No. 10/789,953.
Response to Office Action dated Dec. 21, 2006, in U.S. Appl. No. 11/228,805.
Notice of Allowance dated Mar. 26, 2007, in U.S. Appl. No. 11/228,805.
Response to Office Action dated Jan. 26, 2007, in U.S. Appl. No. 10/851,542.
Notice of Allowance dated Feb. 22, 2007, in U.S. Appl. No. 10/851,542.
Supplemental Notice of Allowance dated Mar. 15, 2007, in U.S. Appl. No. 10/851,542.
Voluntary Amendment dated Mar. 8, 2007, in TW Appl. No. 93114518.
Application filed Mar. 22, 2007.
Preliminary Amendment dated Jul. 21, 2006, in U.S. Appl. No. 11/297,057.
Supplemental Preliminary Amendment, Substitute Specification with Markings, Substitute Specification without Markings, and Replacement Drawing Sheets dated Dec. 6, 2006 in U.S. Appl. No. 11/297,057.
Continuation application and Preliminary Amendment dated Dec. 13, 2006.
Campbell et al., "Titanium dioxide ($TiO_2$)-based gate insulators," *IBM J. Res. Develop.* 43(3), 383-391, (May 1999).
Chen et al. "Development of Supported Bifunctional Electrocatalysts for Unitized Regenerative Fuel Cells," *Journal of the Electrochemical Society*, 149(8), A1092-99, (2002).
Crowder, et al., "Low-Temperature Single-Crystal Si TFT's Fabricated on Si Films Processed via Sequential Lateral Solidification," IEEE, vol. 19, No. 8 (Aug. 1998), pp. 306-308.
Goossens et al., "Sensitization of $TiO_2$ with p-type semiconductor polymers," Delft Interfaculty Research Center, Delft University of Technology Laboratory of Inorganic Chemistry, The Netherlands (1998).
Greene et al., "Morphological and electrical properties of rf sputtered Y2O3-doped ZrO2 thin films," J. Vac. Sci. Tecnol., vol. 13, No. 1 (Jan./Feb. 1976), pp. 72-75.
Hayfield, P.C.S., "Development of a New Material-Monolithic Ti4O7 Ebonix Ceramic, Royal Society Chemistry," (2002).
Im, et al. "Controlled Super-lateral Growth of Si Films for Microstructural Manipulation and Optimization," Materials Science Program (1998), pp. 603-617.
Im, et al., "Crystalline Si Films for Integrated Active-Matrix LiquidCrystal Displays," MrS Bulletin (Mar. 1996), pp. 39-48.
Im, et al., "Single-crystal Si films for thin-film transistor devices," American Institute of Physics (1997), pp. 3434-3436.
Janssen et al. "Photoinduced electron transfer from conjugated polymers onto nanocrystalline $TiO_2$," Eindhoven University of Technology, The Netherlands (date unknown).
Lee et al. "Effects of interfacial layer growth on the electrical characteristics of thin titanium oxide films on silicon," *Applied Physics Letters*, 74(21), 3143-3145, (May 1999).
Mardare et al. "On the structure of Titanium Oxide Thin Films," *Analele Stiintifice Ale Universitatii AL. I. Cuza IASI*, vol. XLV-XLVI, 201-208 (1999).
Mizuno et al. "Temperature dependence of oxide decomposition on titanium surfaces in UHV," submitted to Journal of Vacuum Science and Technology, (Oct. 28, 2001).
Ohmi et al., "Rare earth metal oxides for high-K gate insulator," Tokyo Institute of Technology,(date unknown).
Sanyo Vacuum Industries Co., Ltd. Products Info, $TiO_2$, (2003). http://www.sanyovac.co.jp/Englishweb/products/ETiO2.htm.
Seventh International Conference on $TiO_2$ Photocatalysis: Fundamentals & Applications, Toronto, Ontario, Canada, Final Program (Nov. 17-21, 2002).
Tukamoto, H. et al., "Electronic Conductivity of $LiCoO_s$ and Its Enhancement by Magnesium Doping," J. Electrochem. Soc., vol. 44, No. 9, pp. 3164-3168 (Sep. 1997).
Von Rottkay et al. "Influence of stoichiometry on electrochromic cerium-titanium oxide compounds," Lawrence Berkeley National Laboratory, UC Berkeley, CA, (date unknown).
Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Mar. 10, 2005 in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued Jan. 13, 2005 in U.S. Appl. No. 10/101,863.
Response to Office Action filed on Jun. 10, 2005 in U.S. Appl. No. 10/101,863.
Office Action issued Mar. 25, 2005 in U.S. Appl. No. 10/954,182.
Office Action issued May 4, 2004 in U.S. Appl. No. 10/101,493.
Office Action issued Mar. 24, 2005 in U.S. Appl. No. 10/851,542.
Dorey, R.A., "Low temperature micromoulding of functional ceramic devices," Grant summary for GR/S84156/01 for the UK Engineering and Physical Sciences Research Council, 2 pages (2004).
Office Action issued on Aug. 4, 2005, in U.S. Appl. No. 10/101,863.
Office Action issued on Aug. 8, 2005 in U.S. Appl. No. 10/101,341.
Hwang, M-S. et al., "The effect of pulsed magnetron sputtering on the properties of indium tin oxide thin films," Surface and Coatings Tech. 171:29-33 (2003).
Kim, H-K. & Yoon, Y., "Characteristics of rapid-thermal-annealed LiCoO2 cathode film for an all-solid-state thin film microbattery," J. Vac. Sci. Technol. A 22(4):1182-1187 (2004).
Snoeks, E. et al., "Cooperative upconversion in erbium-implanted soda-lime silicate glass optical waveguides," J. Opt. Soc. Am. B 12(8):1468-1474 (1995).
Response to Office Action filed on Oct. 17, 2005 in U.S. Appl. No. 10/291,179.
Final Office Action issued on Dec. 14, 2005 in U.S. Appl. No. 10/291,179.
Response to Final Office Action filed Apr. 14, 2006, in U.S. Appl. No. 10/291,179.
Office Action mailed Apr. 27, 2006, in U.S. Appl. No. 10/291,179.
Response to Office Action filed Jul. 27, 2006, in U.S. Appl. No. 10/291,179.

(56) References Cited

OTHER PUBLICATIONS

Final Office Action dated Oct. 12, 2006, in U.S. Appl. No. 10,291,179.
Response to Final Office Action mailed Nov. 3, 2006, in U.S. Appl. No. 10/291,179.
Notice of Allowance issued on Oct. 8, 2002, in U.S. Patent No. 6,533,907.
Response to Office Action filed Dec. 5, 2005, in U.S. Appl. No. 10/101,863.
Final Office Action issued on Feb. 14, 2006, in U.S. Appl. No. 10/101,863.
Response to Office Action filed Feb. 24, 2006, in U.S. Appl. No. 10/101,863.
Office Action mailed Mar. 22, 2006, in U.S. Appl. No. 10/101,863.
Response to Office Action filed Jun. 12, 2006, in U.S. Appl. No. 10/101,863.
Office Action mailed Sep. 6, 2006, in U.S. Appl. No. 10/101,863.
Response to Office Action filed on Jul. 25, 2005 in U.S. Appl. No. 10/954,182.
Office Action issued on Oct. 25, 2005, in U.S. Appl. No. 10/954,182.
Response to Office Action filed on Dec. 21, 2005 in U.S. Appl. No. 10/954,182.
Office Action issued on Mar. 9, 2006, in U.S. Appl. No. 10/954,182.
Response to Office Action filed on Aug. 9, 2006 in U.S. Appl. No. 10/954,182.
Office Action dated Oct. 31, 2006, in U.S. Appl. No. 10/954,182.
Office Action issued on Dec. 2, 2005 in U.S. Appl. No. 10/789,953.
Response to Office Action filed Mar. 2, 2006 in U.S. Appl. No. 10/789,953.
Final Office Action issued on May 19, 2006 in U.S. Appl. No. 10/789,953.
Response to Final Office Action filed Aug. 3, 2006, in U.S. Appl. No. 10/789,953.
Notice of Allowance mailed Oct. 23, 2006, in U.S. Appl. No. 10/789,953.
Office Action dated Oct. 12, 2006, for U.S. Appl. No. 11/228,805.
Office Action dated Sep. 22, 2006 from Korean Patent Office in Application No. 10-2005-7016055.
Response to Office Action mailed Nov. 8, 2006, to the Korean Patent Office in Application No. 10-2005-7016055.
Office Action from Singapore Patent Office in Appl. No. 200505388-9, dated Mar. 20, 2006.
Response to Office Action from Singapore Patent Office in Appl. No. 200505388-9, dated Aug. 11, 2006.
Response to Office Action dated Jul. 25, 2005 in U.S. Appl. No. 10/851,542.
Office Action issued on Oct. 19, 2005 in U.S. Appl. No. 10/851,542.
Response to Office Action filed Jan. 19, 2006 in U.S. Appl. No. 10/851,542.
Office Action mailed Apr. 19, 2006 in U.S. Appl. No. 10/851,542.
Response to Office Action filed Jul. 26, 2006 in U.S. Appl. No. 10/851,542.
Final Office Action dated Oct. 26, 2006, in U.S. Appl. No. 10/851,542.
PCT International Search Report and Written Opinion for Application No. PCT/US2004/014524 dated Mar. 2, 2005.
PCT International Preliminary Report on Patentability for Application No. PCT/US2004/014524, dated Dec. 8, 2005.
PCT International Search Report and Written Opinion for Application No. PCT/US2004/014523 dated Jan. 17, 2005.
PCT International Preliminary Report on Patentability for Application No. PCT/US2004/014523, dated Dec. 8, 2005.
Voluntary Amendment filed Aug. 15, 2006 in TW Appl. No. 94143175.
PCT International Search Report and Written Opinion for Application No. PCT/US05/44781 dated Oct. 3, 2006.
Specification as filed Sep. 2, 2005, for U.S. Appl. No. 11/218,652.
Office Action dated Nov. 15, 2007, in U.S. Appl. No. 10/101,863.
Amendment/RCE filed Oct. 24, 2007, in U.S. Appl. No. 10/954,182.
Office Action dated Nov. 15, 2007, in U.S. Appl. No. 10/954,182.
Response to Office Action dated Nov. 21, 2007, in U.S. Appl. No. 10/291,179.
Notice of Allowance dated Mar. 4, 2008, in U.S. Appl. No. 10/291,179.
Response to Office Action dated Dec. 18, 2007, in U.S. Appl. No. 10/101,863.
Notice of Allowance dated Jan. 25, 2008, in U.S. Appl. No. 10/101,863.
Response to Office Action dated Dec. 18, 2007, in U.S. Appl. No. 10/954,182.
Notice of Allowance dated Feb. 1, 2008, in U.S. Appl. No. 10/954,182.
Office Action dated May 29, 2008, in U.S. Appl. No. 11/228,834.
Preliminary Amendment dated Mar. 11, 2008, in U.S. Appl. No. 11/228,717.
Notice of Allowance dated Apr. 2, 2008, in U.S. Appl. No. 11/228,717.
EPO Extended Search Report dated Feb. 26, 2008, for EP Application No. 05853649.1.
Office Action dated Feb. 26, 2008, in U.S. Appl. No. 11/218,652.
PCT International Search Report and Written Opinion for Application No. PCT/US06/33315 mailed Feb. 28, 2008.
First Office Action dated Jul. 25, 2008 from the State Intellectual Property Office of People's Republic of China in Appl. No. 200480005515.5.
First Office Action dated Jun. 27, 2008 from the State Intellectual Property Office of People's Republic of China in Appl. No. 200480020874.8.
Lee, W.J. et al. "Optimizing indium tin oxide thin films with bipolar d.c.-pulsed magnetron sputtering for electrochromic device applications", *J. Mater. Sci: Mat in Elec.* vol. 13:751-756 (2002).
Mientus, R. et al., "Reactive magnetron sputtering of tin-doped indium oxide (ITO): influence of argon pressure and plasma excitation mode", *Surface and Coatings Tech.*, vol. 142-144:748-754 (2001).
First Office Action dated Jul. 18, 2008 from the State Intellectual Property Office of People's Republic of China in Appl. No. 200580042305.8.
Response to Office Action filed Jun. 30, 2008, in U.S. Appl. No. 11/218,652.
Office Action dated May 21, 2007, in U.S. Appl. No. 10/291,179.
Final Office Action dated May 2, 2007, in U.S. Appl. No. 10/101,863.
Response to Final Office Action filed Oct. 2, 2007, in U.S. Appl. No. 10/101,863.
Notice of Non-Compliant Amendment dated Apr. 12, 2007, in U.S. Appl. No. 10/954,182.
Response to Notice of Non-Compliant Amendment filed Apr. 23, 2007, in U.S. Appl. No. 10/954,182.
Final Office Action dated Jul. 24, 2007, in U.S. Appl. No. 10/954,182.
Preliminary Amendment dated Sep. 16, 2005, in U.S. Appl. No. 11/228,834.
Preliminary Amendment dated Jul. 27, 2005, in U.S. Appl. No. 11/191,643.
Corrected Preliminary Amendment dated Sep. 19, 2005, in U.S. Appl. No. 11/191,643.
Corrected Notice of Allowance dated Jun. 7, 2007, in U.S. Appl. No. 11/228,805.
Supplemental Notice of Allowance dated Jul. 5, 2007, in U.S. Appl. No. 11/228,805.
Second Supplemental Preliminary Amendment filed May 31, 2007, in U.S. Appl. No. 11/297,057.
PCT International Preliminary Report on Patentability dated Jun. 21, 2007, in International Application No. PCT/US2005/044781.
Response to Office Action filed Sep. 29, 2008, in U.S. Appl. No. 11/228,834.
Notice of Allowance dated Dec. 30, 2008, in U.S. Appl. No. 11/228,834.
Office Action dated Mar. 30, 2009, in U.S. Appl. No. 11/191,643.
Response to First Office Action filed Feb. 9, 2009, with the State Intellectual Property Office of People's Republic of China in Appl. No. 200480005515.5, and English translation.

(56) References Cited

OTHER PUBLICATIONS

First Office Action dated Dec. 5, 2008, from the State Intellectual Property Office of People's Republic of China in Appl. No. 200480021078.6, and English translation.
Response to First Office Action filed Jan. 12, 2009, with the State Intellectual Property Office of People's Republic of China in Appl. No. 200480020874.8, and English translation.
Response to First Office Action filed Feb. 2, 2009, with the State Intellectual Property Office of People's Republic of China in Appl. No. 200580042305.8, and English translation.
Examination Report dated Jul. 24, 2008, for EP Application No. 05853649.1.
Response to Examination Report filed Feb. 3, 2009, for EP Application No. 05853649.1.
Office Action dated Nov. 5, 2008 from the Intellectual Property Office (IPO) in Appl. No. 94143175, and English translation.
Final Office Action dated Oct. 30, 2008, in U.S. Appl. No. 11/218,652.
PCT International Preliminary Report on Patentability for Application No. PCT/US06/33315 mailed Mar. 19, 2009.
Supplemental Notice of Allowance dated Apr. 23, 2009, in U.S. Appl. No. 11/228,834.
Supplemental Notice of Allowance dated Jul. 17, 2008, in U.S. Appl. No. 11/228,717.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Final Office Action dated Apr. 27, 2010, in U.S. Appl. No. 11/191,643.
Amendment with RCE filed Jul. 26, 2010, in U.S. Appl. No. 11/191,643.
Decision for Allowance for Registration dated Feb. 1, 2007, in Application No. 10-2005-7016055.
Certificate of Grant of Patent dated Sep. 28, 2007, in Application No. 200505388-9.
International Preliminary Report on Patentability dated Sep. 15, 2005, in PCT/US2004/005531.
Office Action mailed Mar. 2, 2010, in U.S. Appl. No. 11/726,972.
Amendment and Response to Office Action filed Jun. 2, 2010, in U.S. App. No. 11/726,972.
Response to first Office Action filed Jun. 18, 2009, with the State Intellectual Property Office of P.R.C., in Appl. No. CN200480021078.6.
Second Office Action dated Aug. 14, 2009, from the State Intellectual Property Office of P.R.C., in Appl. No. CN200480021078.6.
Response to second Office Action filed Dec. 29, 2009, with the State Intellectual Property Office of People's Republic of China in Appl. No. 200480021078.6.
Rejection Decision mailed Feb. 5, 2010, from the State Intellectual Property Office of P.R.C., in Appl. No. 200480021078.6.
Second Office Action dated Aug. 14, 2009, from the State Intellectual Property Office of P.R.C. in Appl. No. 200480020874.8.
Response to second Office Action filed Dec. 29, 2009, with the State Intellectual Property Office of People's Republic of China in Appl. No. 200480020874.8.
Office Action mailed Jan. 29, 2010, in U.S. Appl. No. 11/297,057.
Amendment and Response to Office Action filed Apr. 29, 2010, in related U.S. Appl. No. 11/297,057.
Final Office Action mailed Jul. 8, 2010, in U.S. Appl. No. 11/297,057.
Second Office Action dated May 8, 2009, from the State Intellectual Property Office of People's Republic of China in Appl. No. 200580042305.8.
Response to Second Office Action filed Sep. 22, 2009, with the State Intellectual Property Office of P.R.C., in Appl. No. 200580042305.8.
Third Office Action dated Jan. 29, 2010, from the State Intellectual Property Office of People's Republic of China in Appl. No. 200580042305.8.
Communication Under Rule 71(3) EPC—Intent to Grant dated May 27, 2009, in EP Appl. No. 05853649.1.
Office Action dated Apr. 22, 2010, in Korean Appl. No. 10-2007-7014536.
Response to Office Action filed May 5, 2009, with the Intellectual Property Office (IPO) in Appl. No. 94143175.
Written Primary Decision of Rejection dated Jan. 6, 2010, from the Intellectual Property Office (IPO) in Appl. No. 94143175.
Amendment/RCE filed Apr. 30, 2009, in U.S. Appl. No. 11/218,652.
Office Action mailed Jul. 9, 2009, in U.S. Appl. No. 11/218,652.
Amendment in Response to Office Action filed Dec. 8, 2009, in U.S. Appl. No. 11/218,652.
Notice of Allowance mailed Feb. 23, 2010, in U.S. Appl. No. 11/218,652.
Notice of Allowance mailed Jul. 22, 2010, in U.S. Appl. No. 11/218,652.
Written Opinion mailed Apr. 3, 2009, from the Australian Patent Office in SG Appl. No. 200801749-3.
Response to Written Opinion filed Dec. 11, 2009, with the Intellectual Property Office of Singapore, in SG Appl. No. 200801749-3.
Office Action dated Dec. 29, 2010 from Tlplo Attorneys-at-Law in Appl. No. 094143175.
Office Action mailed Aug. 26, 2010, in U.S. Appl. No. 11/726,972.
Office Action dated Feb. 16, 2011, in U.S. Appl. No. 11/191,643.
Office Action dated Jul. 11, 2011, in U.S. Appl. No. 11/191,643.
Office Action mailed Nov. 1, 2010, in U.S. Appl. No. 11/297,057.
Office Action mailed Apr. 8, 2011, in U.S. Appl. No. 11/297,057.
Advisory Action mailed Jun. 17, 2011, in U.S. Appl. No. 11/297,057.
Machine Translation of JP 09-249962 to Arai et al, dated Sep. 22, 1997.
Bouwman et al., "Influence of Diffusion Plane Orientation on Electrochemical Properties of Thin Film $LiCoO_2$ Electrodes", Journal of The Electrochemical Society, 149 (6) A699-A709 (2002), April.
Kim et al., "Electrochemical Stability of Thin-Film $LiCoO_2$ Cathodes by Aluminum-Oxide Coating", Chem. Mater., 15, 1505-1511 (2003), March.
Abraham, K.M. et al., "Inorganic-organic composite solid polymer electrolytes," vol. 147(4) *J. Electrochem. Soc.*, pp. 1251-56 (2000).
Abrahams, I., "$Li_6Zr_2O_7$, a new anion vacancy ccp based structure, determined by ab initio powder diffraction methods," vol. 104, *J. Solid State Chem.*, pp. 397-403 (1993).
Amatucci, G., et al., "Lithium scandium phosphate-based electrolytes for solid state lithium rechargeable microbatteries," *Solid State Ionics*, vol. 60, pp. 357-65 (1993).
Appetecchi, G.B., et al., "Composite polymer electrolytes with improved lithium metal electrode interfacial properties," vol. 145(12), *J. Electrochem. Soc.*, pp. 4126-32 (1998), December.
Bates, J.B., et al., "Electrical properties of amorphous lithium electrolyte thin films,", 53-56 *Solid State Ionics*, pp. 647-54 (1992).
Bates et al., "Thin-Film Lithium Batteries", *New Trends in Electrochemical Technology: Energy Storage Systems for Electronics*, T. Osaka & M. Datta Eds. Gordon and Breach, 2000.
Delmas, C., et al., "Des conducteurs ioniques pseudo-bidimensionnels $Li_8MO_6$ (M = Zr, Sn), $Li_7LO_6$ (L = Nb, Ta) et $Li_5In_2O_6$," *Mat. Res. Bull.*, vol. 14, pp. 619-25 (1979).
Hu, Y-W., et al., "Ionic conductivity of lithium phosphate-doped lithium orthosilicate," *Mat. Res. Bull.*, vol. 11, pp. 1227-30 (1976), June.
Jones et al., "A Thin Film Solid State Microbattery," *Solid State Ionics*, vol. 53-56, pp. 628-634 (1992).
Mattox, *Handbook of Physical Vapor Deposition (PVD) Processing*, Society of Vacuum Coaters, Albuquerque, New Mexico 660f and 692ff, Noyes Publications (1998), Ch 11, pp .616-663.
Neudecker, B., et al., "$Li_9SIAlO_8$: a lithium ion electrolyte for voltages above 5.4 V," *Electrochem. Soc.*, vol. 143(7), pp. 2198-203 (1996), July.
Ohno, H., et al., "Electrical conductivity of a sintered pellet of octalithium zirconate," *J. Nucl. Mat.*, vol. 132, pp. 222-30 (1985).

(56) References Cited

OTHER PUBLICATIONS

Sarro, P., "Silicon Carbide as a New Mems Technology," *Sensors and Actuators*, vol. 82, pp. 210-218 (2000).

Scholder, V., et al., "Über Zirkonate, Hafnate und Thorate von Barium, Strontium, Lithium und Natrium," *Zeitschrift far Anorganische und Allgemeine Chemie*, Band 362, pp. 149-168 (1968).

Wang, B., et al., "Characterization of Thin-Film Rechargeable Lithium Batteries with Lithium Cobalt Oxide Cathodes", *J. Electrochem. Soc.*, vol. 143, pp. 3203-13 (1996), October.

Yu, X., et al., "A stable thin-film lithium electrolyte: lithium phosphorous oxynitride," *J. Electrochem. Soc.*, vol. 144(2), pp. 524-532 (1997), February.

Lee, W.J. et al. "Optimizing indium tin oxide thin films with bipolar d.c.-pulsed magnetron sputteringfor electrochromic device applications", J. Mater. Sci: Mat in Elec. 13:751-756 (2002).

Mientus, R. et al., "Reactive magnetron sputtering of tin-doped indium oxide (ITO): influence of argon pressure and plasma excitation mode", Surface and Coating Tech. 142-144:748-754 (2001).

Kelly, P.J. et al., "A novel technique for the deposition of aluminum-doped zinc oxide films," Thin Solid Films 426(1-2):111-116 (2003).

Snoeks, E. et al., "Cooperative upconversion in erbium-implanted soda-lime silicate glass optical waveguides," J. Opt. Soc. Am. B 12(8):1468-1474 (1995), August.

Hwang et al., "Characterization of sputter-deposited LiMn2O4 thin films for rechargeable microbatteries", J. Electrochem. Soc., vol. 141, No. 12, Dec. 1994, pp. 3296-3299.

Kim et al., "Characteristics of rapid-thermal-annealed LiCoO$_2$ cathode film for an all-solid-state thin film microbattery", J. Vac. Sci. Technol. A, vol. 22, No. 4, Jul./Aug. 2004, pp. 1182-1187.

Anh et al., "Significant Suppression of Leakage Current in (Ba, Sr)Tio$_3$ Thin Films by Ni or Mn Doping," J. Appl. Phys., vol. 92, No. 5, pp. 2651-2654 (Sep. 2002).

Belkind, a. et al., "Pulsed-DC Reactive Sputtering of Dielectrics: Pulsing Parameter Effects, "43$^{rd}$ Annual Technical Conference Proceedings, Denver, Apr. 15-20, 2000, pp. 86-90.

Choy et al., "Eu-Doped Y2O3 Phosphor Films Produced by Electrostatic-Assisted Chemical Vapor Deposition," J. Mater. Res., vol. 14, No. 7, pp. 3111-3114 (Jul. 1999).

Kim et al., "Correlation Between the Microstructures and the Cycling Performance of RuO$_2$ Electrodes for Thin-Film Microsupercapacitors," J. Vac. Sci. Technol., vol. B 20(5), pp. 1827-1832 (Sep. 2002).

Park et al., "Characteristics of Pt Thin Film on the Conducting Ceramics TiO and Ebonex (Ti$_4$O$_7$) as Electrode Materials," Thin Solid Films, 258, pp. 5-9 (1995).

Saha et al., "Large Reduction of Leakage Current by Graded-Layer La Doping in (Ba$_{0.5}$, Sr$_{0.5}$)TiO$_3$ Thin Films," Applied Physics Letters, vol. 79, No. 1, pp. 111-113 (Jul. 2001).

Scholl, R., "Power Supplies for Pulsed Plasma Technologies: State-of-the-Art and Outlook," Advances Energy Industries, Inc., White paper, pp. 1-8 (1999).

Scholl, R., "Power Systems for Reactive Sputtering of Insulating Films," Advances Energy Industries, Inc., White paper, pp. 1-8 (Aug. 2001).

Cocorullo, G. et al., "Amorphous silicon waveguides and light modulators for integrated photonics realized by low-temperature plasma-enhanced chemical-vapor deposition," *Optics Lett.* 21(24):2002-2004 (1996), August.

Tomaszewski, H. et al., "Yttria-stabilized zirconia thin films grown by reactive r.f. magnetron sputtering," *Thin Solid Films* 287:104-109 (1996), January.

Affinito, J.D. et al., "PML/oxide/PML Barrier Layer Performance Differences Arising from Use of UV or Electron Beam Polymerization of the PML Layers," *Thin Solid Films* 308-309:19-25 (1997).

Affinito, J.D. et al., "Polymer-Oxide Transparent Barrier Layers," Society of Vacuum Coaters, 39$^{th}$ Ann. Technical Conference Proceedings, May 5-10, 1996, Philadelphia, PA, pp. 392-397 (1996).

Alder, T. et al., "High-Efficiency Fiber-to-Chip Coupling Using Low-Loss Tapered Single-Mode Fiber," *IEEE Photonics Tech. Lett.* 12(8):1016-1018 (2000), August.

Almeida, V.R. et al., "Nanotaper for compact mode conversion," *Optics Letters* 28(15):1302-1304 (2003), August.

Aschari, M. And Dawnay, E., "ASOC™—A Manufacturing Integrated Optics Technology," *SPIE* 3620:252-262 (Jan. 1999).

Barbier, D. et al, "Amplifying Four-Wavelength Combiner, Based on Erbium/Ytterbium-Doped Waveguide Amplifiers and Integrated Splitters," *IEEE Photonics Tech. Lett.*.9:315-317 (1997), March.

Barbier, D., "Performances and potential applications of erbium doped planar waveguide amplifiers and lasers," *Proc. OAA*, Victoria, BC, Canada, pp. 58-63 [72-92] (Jul. 21-23, 1997).

Beach R.J., "Theory and optimization of lens duets," *Applied Optics* 35(12):2005-2015 (1996), April.

Belkind, A. et al., "Using pulsed direct current power for reactive sputtering of Al$_2$O$_3$," J. Vac. Sci. Technol. A 17(4):1934-1940 (1999), July/Aug.

Bestwick, T., "ASOC™silicon integrated optics technology," SPIE 3631:182-190 (1999), Jan.

Borsella, E. et al., "Structural incorporation of silver in soda-lime glass by the ion-exchange process: a photoluminescence spectroscopy study," *Applied Physics* A 71:125-132 (2000), June.

Byer, R.L., "Nonlinear Optics and Solid-state Lasers: 2000," *IEEE J. Selected Topics in Quantum Electronics* 6(6):911-930 (2000), Nov/Dec.

Campbell, S.A. et al., "Titanium dioxide (TiO$_2$)-based gate insulators," IBM J. Res. Develop. 43(3):383-392 (1999), May.

Chang, C.Y. And SZE, S.M. (Eds.), in: *ULSI Technology*, The McGraw-Hill Companies, Inc., New York, Chapter 4, pp. 169-170, and 226-231 (1996).

Chen, G. et al. "Development of Supported Bifunctional Electrocatalysts for Unitized Regenerative Fuel Cells," *J. Electrochemical Society* 149(8):A1092-A1099 (2002), July.

Choi, Y.B. et al., "Er-Al-codoped silicate planar light waveguide-type amplifier fabricated by radio-frequency sputtering," *Optics Letters* 25(4):263-265 (2000), Feb.

Cooksey, K. et al. "Predicting Permeability & Transmission Rate for Multilayer Materials," *Food Technology* 53(9):60-63 (1999), Sept.

Crowder, M.A. et al., "Low-Temperature Single-Crystal Si TFT's Fabricated on Si Films Processed via Sequential Lateral Solidification," *IEEE Electron Device Lett.* 19(8):306-308 (1998), Aug.

Delavaux, J-M. et al., "Integrated optics erbium ytterbium amplifier system in 10Gb/s fiber transmission experiment," 22$^{nd}$ European Conference on Optical Communication, Oslo, I.123-1.126 (1996).

Distributed Energy Resources: Fuel Cells, Projects, 4 pages http://www.eere.energy.gov/der/fuel_cells/groiects.html (2003).

Dorey, R.A., "Low temperature micromoulding of functional ceramic devices," Grant summary for No 1,40 Gr/S84156/01 for the Uk Engineering and Physical Sciences Research Council, 2 pages (2004).

E-Tek website: FAQ, Inside E-Tek, E-Tek News, Products: http://www.wtwk-inc.com/ , 10 pages (2003), May.

Frazao, O. et al., "EDFA Gain Flattering Using Long-Period Fiber Grating Based on the Electric Arc Technique," *Proc. London Comm. Symp. 2001*, London England, 3 pages (2001).

Fujii, M. et al., "1.54 µm photoluminescence of Er$^{3+}$doped into SiO$_2$ films containing Si nanocrystals: Evidence for energy transfer from Si nanocrystals for Er$^{3+}$,"*Appl. Phys. Lett.* 71(9):1198-1200 (1997), June.

Garcia, C. et al. "Size Dependence of Lifetime and Absorption Cross Section of Si Nancrystals Embedded in SiO$_2$," *Appl. Phys. Lett.* 82(10):1595-1597 (2003), Jan.

Savenije, Tom J. et al., "Visible light sensitisation of titanium dioxide using a phenylene vinylene polymer," *Chem. Phys. Lett.* 287:148-153 (1998), Jan.

Greene, J.E. et al., "Morphological and electrical properties of rf sputtered Y$_2$O$_3$-doped ZrO$_2$ thin films," *J. Vac. Sci. Tech.* 13(1):72-75 (1976), Jan./Feb.

Han, H.-S. et al. "Optical Gain at 1.54 µm in Erbium-Doped Silicon Nancluster Sensitized Waveguide," *Appl. Phys. Lett.* 79(27):4568-4570 (2001), Sept.

Hayakawa, T. et al., "Enhanced fluorescence from Eu$^{3+}$owing to surface plasma oscillation of silver particles in glass," *J. Non-Crystalline Solids* 259:16-22 (1999).

(56) References Cited

OTHER PUBLICATIONS

Hayakawa, T. et al, "Field enhancement effect of small Ag particles on the fluorescence from $Eu^{3+}$-doped $SiO_2$ glass," *Appl. Phys. Lett.* 74(11):1513-1515 (1999), Jan.

Hayfield, P.C.S., in: *Development of a New Material-Monolithic $Ti_4O_7$ Ebonix® Ceramic*, Royal Society of Chemistry, Cambridge, Table of Contents, 4 pages (2002).

Hehlen, M.P. et al. "Spectroscopic Properties of $Er^{3+}$- and $Yb^{3+}$-doped Soda-Lime Silicate and Aluminosilicate Glasses," *Physical Review B* 56(15):9302-9318 !997), Oct.

Hehlen, M.P. et al. "Uniform Upconversion in High-Concentration $Er^{3+}$-doped Soda Lime Silicate and Aluminosilicate Glasses," *Optics Letters* 22(11):772-774 (1997), June.

Horst, F. et al., "Compact, Tunable Optical Devices in Silicon-Oxynitride Waveguide Technology," *Top. Meeting Integrated Photonics Res.* '00, Quebec, Canada, pp. 110/IThF1-1 to 113/IThF1-3, 3 pages (2000).

Howson, R.P., "The reactive sputtering of oxides and nitrides," *Pure & Appl. Chem.* 66(6):1311-1318 (1994).

Hubner, J. And Guldberg-Kjaer, S., "Planar Er-and Yb-Doped Amplifiers and Lasers," COM Technical University of Denmark, $10^{th}$ European Conf. On Integrated Optics, Session WeB2, Appl. Phys. B 73, pp. 435-438 (2001).

Hwang, M-S. et al., "The effect of pulsed magnetron sputtering on the properties of indium tin oxide thin films," *Surface and Coating Tech.* 171:29-33 (2003).

Im, J.S. et al. "Controlled Super-Lateral Growth of Si Films for Microstructural Manipulation and Optimization," *Physica Status Solidi (A)* 166(2):603-617 (1998), Feb.

Im, J.S. And Sposili, R.S., "Crystalline Si Films for Integrated Active-Matrix Liquid Crystal Displays," *MRS Bulletin*, pp. 39-48 (1996).

Im, J.S. et al., "Single-crystal Si films for thin-film transistor devices," *Appl. Physics Lett.* 70(25):3434-3436 (1997), April.

Itoh, M. et al., "Large reduction of singlemode-fibre coupling loss in 1.5% Δ planar lightwave circuits using spot-size converters," *Electronics Letters* 38(2):72-74 (2002), Jan.

Janssen, R. et al. "Photoinduced electron transfer from conjugated polymers onto nanocrystalline TiO2," Synthetic Metals 101, pp. 265-266, (1999).

Johnson, J.E. et al., "Monolithically Integrated Semiconductor Optical Amplifier and Electroabsorption Modulator with Dual-Waveguide Spot-Size Converter Input," *IEEE J. Selected Topics in Quantum Electronics* 6(1):19-25 (2000), Jan./Feb.

Jonsson L.B. et al. "Frequency response in pulsed DC reactive sputtering processes," *Thin Solid Films* 365:43-48 (2000).

Kato, K. And Inque, Y., "Recent progress on PLC hybrid integration," *SPIE.* 3631:28-36 (1999), Jan.

Kato, K. And Tohmori, Y., "PLC Hybrid Integration Technology and Its Application to Photonic Components," *IEEE J. Selected Topics in Quantum Electronics* 6(1):4-13 (2000), Jan./Feb.

Kelly, P.J. and Arnell, R.D., "Control of the structure and properties of aluminum oxide coatings deposited by pulsed magnetron sputtering," *J. Vac. Sci. Technol. A* 17(3):945-953 (1999), May/June.

Kik, P.G. and Polman, A., "Gain Limiting Processes in Er-doped Si Nanocrystal Waveguides in $SiO_2$," *J. Appl. Phys.* 91(1):534-536 (2002), Jan.

Kim, H-K. et al., "Characteristics of rapid-thermal-annealed $LiCoO_2$ cathode film for an all-solid-state thin film microbattery," *J. Vac. Sci. Technol. A* 22(4):1182-1187 (2004), July/Aug.

Kim, J-Y. et al. "Frequency-dependent pulsed direct current magnetron sputtering of titanium oxide films," *J. Vac. Sci. Technol. A* 19(2):429-434 (2001), Mar/Apr.

Kim, D-W. et al. "Mixture Behavior and Microwave Dielectric Properties in the Low-fired $TiO_2$-CuO System," *Jpn. J. Appl. Phys.* 39:2696-2700 (2000). May.

Ladouceur, F. And Love, J.D., in: *Silica-based Buried Channel Waveguides and Devices*, Chapman & Hall, Londo, Table of Contents, 6 pages (1996).

Ladouceur, F. et al., "Effect of side wall roughness in buried channel waveguides," *IEEE Proc. Optoelectron.* 141(4):242-248 (1994). Aug.

Lange, M.R. et al, "High Gain Ultra-Short Length Phosphate glass Erbium-Doped Fiber Amplifier Material," OSA Optical Fiber Communications (OFC), pp. 1-3, 3 pages. (2002).

Laporta, P. et al, "Diode-pumped cw bulk Er: Yb:glass laser," *Optics Letters* 16(24):1952-1954 (1991). Dec.

Laurent-Lund, C. et al., "PECVD Grown Multiple Core Planar Waveguides with Extremely Low Interface Reflections and Losses," *IEEE Photonics Tech. Lett.* 10(10):1431-1433 (1998). Oct.

Lee, K.K. et al., "Effect of size and roughness on light transmission in a $Si/SiO_2$ waveguide: Experiments and model," *Appl, Phys. Lett.* 77(11):1617-1619 (2000). Sep.

Lee, B.H. et al., "Effect of interfacial layer growth on the electrical characteristics of think titanium oxide films on silicon," *Appl. Phys. Lett.* 74(21):3143-3145 (1999). May.

Love, J.D. et al., "Quantifying Loss Minimisation in Single-Mode Fibre Tapers," *Electronics Letters* 22(17):912-914 (1986). Aug.

Mardare, D. And Rusu, G.I., "On the structure of Titanium Oxide Thin Films," *Analele Stiintifice Ale Universitatii IASI*, Romania, pp. 201-208 (1999).

Meijerink, A. et al., "Luminescence if $Ag^+$in Crystalline and Glassy $SrB_4O_7$," J. Physics Chem. Solids 54(8):901-906 (1993). Apr.

Mesnaoui, M. et al, "Spectroscopic properties of $Ag^+$ions in phosphate glasses of $NaPO_3$-$AgPO_3$ system," *Eur. J. Solid State Inorg. Chem.* 29:1001-1013 (1992). Jan.

Mitomi, O. et al., "Design of a Single-Mode Tapered Waveguide for Low-Loss Chip-toFiber Coupling," *IEEE J. Quantum Electronics* 30(8):1787-1793 (1994). Aug.

Mizuno, Y. et al. "Temperature dependence of oxide decomposition on titanium surfaces in UHV," *J. Vac. Sci. & Tech. A* 20(5)1716-1721 (2002). Sep./Oct.

Ohmi, S. et al., "Rare earth metal oxides for high-K gate insulator," VLSI Design 2004, 1 page (2004).

Ohtsuki, T. et al., "Gain Characteristics of a high concentration $Er^{3+}$-doped phosphate glass waveguide," J. Appl. Phys. 78(6):3617-3621 (1995). Jun.

Padmini, P. et al., :Realization of High Tunability Barium Strontium Titanate Thin Films by rf Magnetron Sputtering, *Appl. Phys. Lett.* 75(20):3186-3188 (1999). Nov.

Pan, T. et al., "Planar $Er^{3+}$doped aluminosilicate waveguide amplifier with more than 10 dB gain across C-band," Optical Society of America, 3 pages (2000).

Peters, D.P. et al., "Formation mechanism of silver nanocrystals made by ion irradiation of $Na^+$<-> $Ag^+$ion-exchanged sodalime silicate glass," *Nuclear Instruments and Methods in Physics Research B* 168:237-244 (2000).

Rajarajan, M. et al., "Numerical Study of Spot-Size Expanders for an Efficient OEIC to SMF Coupling," *IEEE Photonics Technology Letters* 10(8):1082-1084 (1998). Aug.

Ramaswamy, R.V. et al., "Ion-Exchanged Glass Waveguides: A Review," *J. Lightwave Technology* 6(6):984-1002 (1988). Jun.

Roberts, S.W. et al., "The Photoluminescence of Erbium-doped Silicon Monoxide," University of Southampton, Department of Electronics and Computer Science Research Journal, pp. 99-102, 4 pages. (1996).

Sanyo Vacuum Industries Co., Ltd. Products Info, $TiO_2$ (2003), 1 page, printed from web Apr. 29, 2003, http://www.sanvovac.co.ip/Englishweb/products/ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al. "PVD Coating of Plastic Webs and Sheets with High Rates on Large Areas," European Materials Research Society 1999 Spring Meeting, Jun. 1-4, 1999, Strasbourg, France, pp. 354-360, 7 pages (1999).

Sewell, P. et al., "Rib Waveguide SpotOSize Transformers: Modal Properties," *J. Lightwave Technology* 17(5):848-856 (1999). May.

Shaw, D.G. et al., "Use of Vapor Deposited Acrylate Coating to Improve the Barrier Properties of Metallized Film," Society of Vacuum Coaters, $37^{th}$ Annual Technical Conference Proceedings, pp. 240-247 (1994).

(56) References Cited

OTHER PUBLICATIONS

Shin, J.C. et al. "Dielectric and Electrical Properties of Sputter Grown (Ba,Sr) TiO3 Thin Films," *J. Appl. Phys.* 86(1):506-513 (1999). Jul.

Shmulovich, J. et al., "Recent progress in Erbium-doped waveguide amplifiers," Bell Laboratories, pp. 35-37 (1999).

Slooff, L.H. et al, "Optical properties of Erbium-doped organic polydentate cage complexes," *J. Appl. Phys.* 83(1):497-503 (1998).

Smith, R. E. et al., "Reduced Coupling Loss Using a Tapered-Rib Adiabatic-Following Fiber Coupler," *IEEE Photonics Technology Lett.* 8(8):1052-1054 (1996), August.

Tervonen, a., "Challenges and opportunities for integrated optical networks," SPIE 3620:2-11 (1999).

Ting, C.Y. et al., "Study of planarized sputter-deposited $SiO_2$," *J. Vac. Sci. Technol*, 15(3):1105-1112 (1978), May/June.

Treichel, O. And Kirchhoff, V., "The influence of pulsed magnetron sputtering on topography and crystallinity of TiO2 films on glass," *Surface and Coatings Technology* 123:268-272 (2000).

Tukamoto, H. And West, A.R., "Electronic Conductivity of $LiCoO_s$ and Its Enhancement by Magnesium Doping," *J. Electrochem. Soc.* 144(9):3164-3168 (1997), Sept.

Van Dover, R.B., "Amorphous Lanthanide-Doped $TiO_x$ Dielectric Films," *Appl. Phys. Lett.* 74(20):30413043 (1999), May.

Viljanen, J. And Leppihalme, M., "Planar Optical Coupling Elements for Multimode Fibers with Two-Step Ion Migration Process," *Applied Physics* 24(1):61-63 (1981).

Villegas, M.A. et al., "Optical spectroscopy of a soda lime glass exchanged with silver," *Phys. Chem. Glasses* 37(6):248-253 (1996), Dec.

Von Rottkay, K. et al., "Influence of stoichiometry on electrochromic cerium-titanium oxide compunds," Presented at the 11th Intl. Conference of Solid State Ionics, Honolulu, Hawaii, Nov. 19, 1997, Published in *Solid State Ionics* 113415:425-430. (1998).

Westlinder, J. et al., "Simulation and Dielectric Characterization of Reactive dc Magnetron Cosputtered $(Ya_2O_5)_{1-x}(TiO_2)_x$ Thin Films," *J. Vac. Sci. Technol. B* 20(3):855-861 (May/Jun. 2002).

Yanagawa, H. et al., "Index-and-Dimensional Taper and Its Application to Photonic Devices," *J. Lightwave Technology* 10(5):587-592 (1992), May.

Yoshika, K. et al., "Spray formed aluminum alloys for sputtering targets," *Powder Metallurgy* 43(3):198-199 (2000).

Zhang, H. et al. "High Dielectric Strength, High k $TiO_2$ Films by Pulsed DC, Reactive Sputter Deposition," Pp. 124-126, 5 pages total, Mar.-Apr. 2003.

Extended European Search Report and Search Opinion mailed Jan. 12, 2011, in European Appl. No. 06790009.2.

DuPont Teijin Films, Mylar 200 SBL 300, Product Information, 4 pages (2000).

Electrometals Technologies Limited, Financial Report for 2002, Corporate Directory, Chairman's Review, Review of Operations, 10 pages (2002).

Flytzanis, C. et al, "Nonlinear Optics in Composite Materials," in: *Progress in Optics XXIX*, Elsevier Science Publishers B.V., pp. 323-411 (1991).

Jackson, M.K. And Movassaghi, M., "An Accurate Compact EDFA Model," Eur. Conf. Optical Comm., Munich, Germany, 2 pages (2000).

Lamb, W.B., "Designing Nonfoil Containing Skins for VIP Applications," DuPont Via Symposium Presentation, 35 pages (1999).

Lamb, W. And Seiler, R., "Designing Non-Foil Containing Skins for Vacuum Insulation Panel (VIP) Applications," *Vuoto XXVII*(1-2):55-58 (1999).

Marques, P.V.S. et al., "Planar Silica-on-Silicon Waveguide Lasers Based in Two Layer Core Devices," 10th European Conference in Integrated Optics, Session WeB2, pp. 79-82 (2001).

Ohkubo, H. et al., "Polarization-Insensitive arrayed-Waveguide Grating Using Pure $Si)_2$ Cladding," Fifth Optoelectronics and Communication Conference (OECC 2000) Technical Digest, pp. 366-367 (2000).

Ono, H. et al., "Design of a Low-loss Y-branch Optical Waveguide," Fifth Optoelectronic and Communications Conference (OECC 2000) Technical Digest, pp. 502-503 (2000).

Second International Symposium of Polymer Surface Modification: Relevance to Adhesion, Preliminary Program, 13 pages (1999).

Seventh International Conference on $TiO_2$ Photocatalysis: Fundamentals & Applications, Toronto, Ontario, Canada, Final Program, 7 pages (Nov. 17-21, 2002).

Strohhofer, C. And Polman, A. "Energy transfer to $Er^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminium Foil," *Vuoto XXVIII*(1-2):51-54 (1999).

Wilkes, K.E., "Gas Permeation Through Vacuum Barrier Films and its Effect on VIP Thermal Performance," presented at the Vacuum Insulation Panel Symp., Baltimore, Maryland, 21 pages. (May 3, 1999).

* cited by examiner

TRANSPARENT CONDUCTIVE OXIDES

RELATED APPLICATIONS

The present application claims priority to U.S. Provisional Application 60/473,379, "Transparent Conductive Oxides from a Metallic Target," by R. Ernest Demaray and Mukundan Narasimhan, filed on May 23, 2003, herein incorporated by reference in its entirety.

BACKGROUND

1. Field of the Invention

The present invention is related to deposition of oxides on a substrate and, in particular, deposition of transparent conductive oxides.

2. Discussion of Related Art

Transparent conductive oxides have a wide variety of uses, including applications to solar cells, organic light emitting diodes (OLEDs), electric field devices, current devices (i.e. touch screens), energy efficient windows, conductive anti-reflective devices, electromagnetic interference shields, heaters, transparent electrodes, coatings for cathode ray tube (CRT) displays, to name only a few. Another important application is for touch sensitive MEMS devices, such as those used, for example, in fingerprint sensors and such. In many cases, the electrical properties of the conducting film is of great importance.

Specifically, for OLED applications, films deposited with current technologies are generally rough, resulting in stress risers and field concentration issues, that can cause leakage. Further, asperities in the resulting film can induce lifetime dependent defects in nearest neighbor films that can shorten device lifetimes. Additionally, the brightness of the emergent light from the OLED can be reduced.

Transparent conductive oxides have been deposited from ceramic targets by RF magnetron sputtering. However, the surface of properties of the resulting films often include nodules or asperites which can cause arcing, defects, surface roughness, and other deleterious effects in the resulting film. Additionally, ceramic targets tend to be more expensive to produce than metallic targets.

Previous attempts at deposition of transparent conductive oxides, for example indium tin oxide (ITO), with metallic targets have presented numerous problems, including small process windows, problems in process controllability, a disappearing anode effect, and particle deposition on the film. Such attempts have been abandoned. Deposition with ceramic targets has also been difficult, including problems with particles, nodule formation, and arching during deposition. In both cases, film smoothness has presented major difficulties. Additionally, control of film parameters such as, for example, resistivity and transparency has been difficult.

Therefore, there is need for cost effective deposition of smoother layers of transparent conductive oxides with greater control over layer properties such as resistivity and transparency.

SUMMARY

In accordance with the present invention, a method of depositing of a transparent conductive film from a metallic target is presented. A method of forming a transparent conductive oxide film according to embodiments of the present invention includes depositing the transparent conductive oxide film in a pulsed DC reactive ion process with substrate bias, and controlling at least one process parameter to provide at least one characteristic of the conductive oxide film at a particular value.

A method of depositing a transparent conductive oxide film on a substrate according to some embodiments of the invention, then, includes placing the substrate in a reaction chamber, adjusting power to a pulsed DC power supply coupled to a target in the reaction chamber, adjusting an RF bias power coupled to the substrate, adjusting gas flow into the reaction chamber, and providing a magnetic field at the target in order to direct deposition of the transparent conductive oxide film on the substrate in a pulsed-dc biased reactive-ion deposition process, wherein the transparent conductive oxide film has a particular characteristic.

The resulting transparent oxide film, which can be deposited according to some embodiments of the present invention, can be an indium-tin oxide (ITO) film. An ITO film can have a wide range of material properties depending on variations in process parameters. For example, varying the process parameters according to some embodiments of the present invention can result in a wide range of resistive properties and surface smoothness of the film.

These and other embodiments of the invention are further discussed below with reference to the following figures.

SHORT DESCRIPTION OF THE FIGURES

In the figures, elements having the same designation have the same or similar function.

DETAILED DESCRIPTION

Deposition of materials by pulsed-DC biased reactive ion deposition is described in U.S. patent application Ser. No. 10/101,863, entitled "Biased Pulse DC Reactive Sputtering of Oxide Films," to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002. U.S. patent application Ser. No. 10/101,863 and U.S. patent application Ser. No. 10/101,341 are each assigned to the same assignee as is the present disclosure and each is incorporated herein in their entirety. Deposition of oxide materials has also been described in U.S. Pat. No. 6,506,289, which is also herein incorporated by reference in its entirety. Transparent oxide films are deposited utilizing processes similar to those specifically described in U.S. Pat. No. 6,506,289 and U.S. application Ser. No. 10/101,863.

Figure 1A:
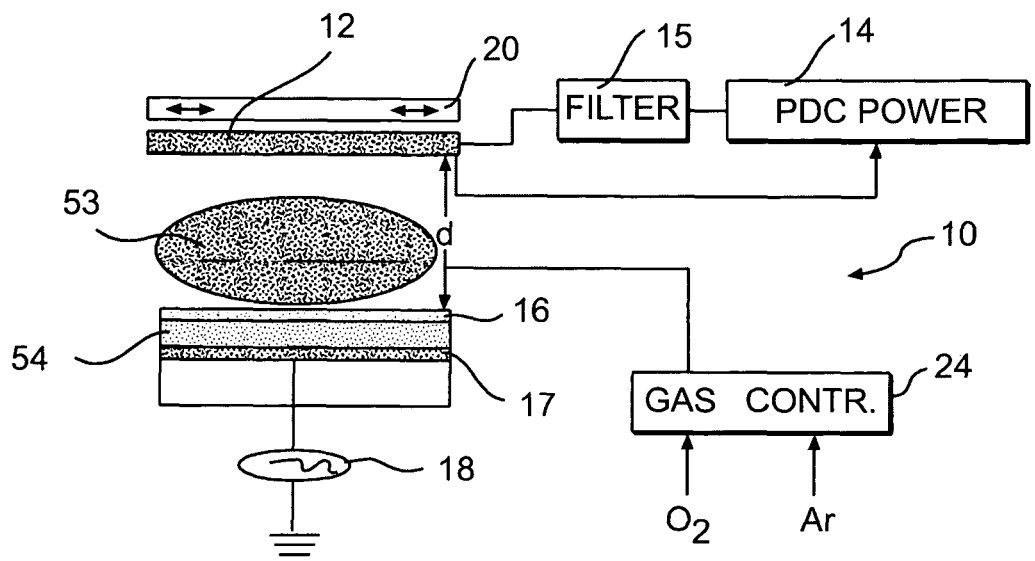
FIGS. 1A and 1B illustrate a pulsed-DC biased reactive ion deposition apparatus that can be utilized in the methods of depositing according to the present invention.

FIG. 1A shows a schematic of a reactor apparatus 10 for sputtering material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These Komatsu reactors can be modified such that pulsed DC power is supplied to the target and RF power is supplied to the substrate during deposition of a material film.

Apparatus 10 includes target 12 which is electrically coupled through a filter 15 to a pulsed DC power supply 14. In some embodiments, target 12 is a wide area sputter source target, which provides material to be deposited on a substrate 16. Substrate 16 is positioned parallel to and opposite target 12. Target 12 functions as a cathode when power is applied to it and is equivalently termed a cathode. Application of power to target 12 creates a plasma 53. Substrate 16 is capacitively coupled to an electrode 17 through an insulator 54. Electrode 17 can be coupled to an RF power supply 18. A magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that can depend on target material, cathode current and reverse time. High quality oxide films can be made using reactive pulse DC magnetron sputtering as shown in apparatus 10.

Pulsed DC power supply 14 can be any pulsed DC power supply, for example an AE Pinnacle plus 10K by Advanced Energy, Inc. With this DC power supply, up to 10 kW of pulsed DC power can be supplied at a frequency of between 0 and 350 KHz. The reverse voltage can be 10% of the negative target voltage. Utilization of other power supplies can lead to different power characteristics, frequency characteristics and reverse voltage percentages. The reverse time on this embodiment of power supply 14 can be adjusted between 0 and 5 µs.

Filter 15 prevents the bias power from power supply 18 from coupling into pulsed DC power supply 14. In some embodiments, power supply 18 can be a 2 MHz RF power supply, for example a Nova-25 power supply made by ENI, Colorado Springs, Co.

In some embodiments, filter 15 can be a 2 MHz sinusoidal band rejection filter. In some embodiments, the band width of the filter can be approximately 100 kHz. Filter 15, therefore, prevents the 2 MHz power from the bias to substrate 16 from damaging power supply 18.

However, both RF and pulsed DC deposited films are not fully dense and may have columnar structures. Columnar structures can be detrimental to thin film applications. By applying a RF bias on wafer 16 during deposition, the deposited film can be densified by energetic ion bombardment and the columnar structure can be substantially eliminated.

In the AKT-1600 based system, for example, target 12 can have an active size of about 675.70×582.48 by 4 mm in order to deposit films on substrate 16 that have dimension about 400×500 mm. The temperature of substrate 16 can be held at between −50° C. and 500° C. The distance between target 12 and substrate 16 can be between about 3 and about 9 cm. Process gas can be inserted into the chamber of apparatus 10 at a rate up to about 200 sccm while the pressure in the chamber of apparatus 10 can be held at between about 0.7 and 6 millitorr. Magnet 20 provides a magnetic field of strength between about 400 and about 600 Gauss directed in the plane of target 12 and is moved across target 12 at a rate of less than about 20-30 sec/scan. In some embodiments utilizing the AKT 1600 reactor, magnet 20 can be a race-track shaped magnet with dimensions about 150 mm by 600 mm.

Figure 1B:
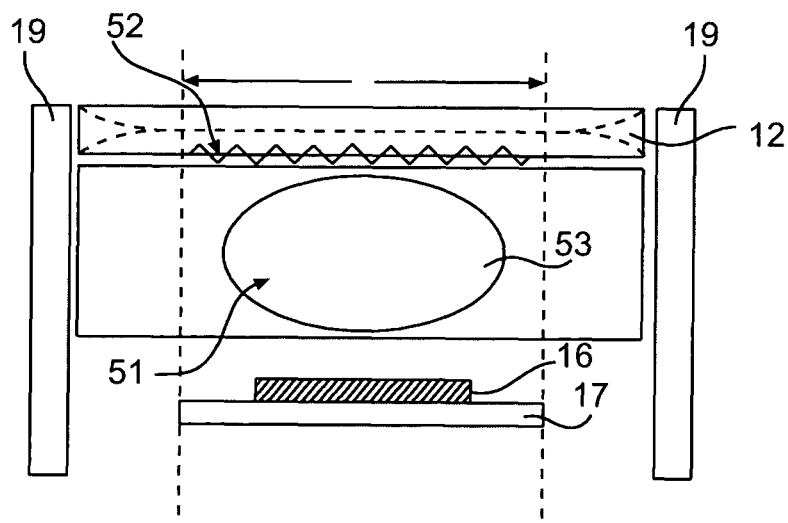
Figure 2:
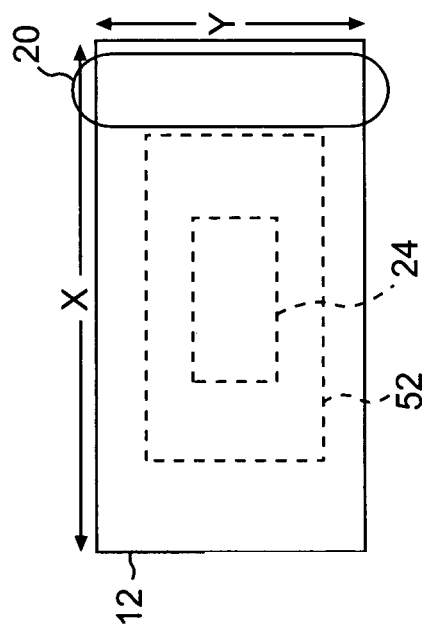
FIG. 2 shows an example of a target that can be utilized in the reactor illustrated in FIGS. 1A and 1B.

FIG. 2 illustrates an example of target 12. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, for example where physical and chemical uniformity provide refractive index uniformity. FIG. 2 indicates region 52 of target 12 that provides thickness uniformity is, in general, larger than region 24 of target 12 providing thickness and chemical uniformity. In optimized processes, however, regions 52 and 24 may be coextensive.

In some embodiments, magnet 20 extends beyond area 52 in one direction, for example the Y direction in FIG. 2, so that scanning is necessary in only one direction, for example the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform optical properties such as index of refraction, density, transmission or absorptivity.

Target 12 can be formed of any materials. Typically metallic materials, for example, include combinations of In and Sn. Therefore, in some embodiments, target 12 includes a metallic target material formed from intermetallic compounds of optical elements such as Si, Al, Er and Yb. Additionally, target 12 can be formed, for example, from materials such as La, Yt, Ag, Au, and Eu. To form optically active films on substrate 16, target 12 can include rare-earth ions. In some embodiments of target 12 with rare earth ions, the rare earth ions can be pre-alloyed with the metallic host components to form intermetallics. See U.S. application Ser. No. 10/101,341. Typical ceramic target materials include alumina, silica, alumina silicates, and other such materials.

In some embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 to 20 individual tiles. Tiles can be finished to a size so as to provide a margin of non-contact, tile to tile, less than about 0.010" to about 0.020" or less than half a millimeter so as to eliminate plasma processes that may occur between adjacent ones of tiles 30. The distance between tiles of target 12 and the dark space anode or ground shield 19 in FIG. 1B can be somewhat larger so as to provide non contact assembly or to provide for thermal expansion tolerance during process chamber conditioning or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12 can experience a condition of uniform sputter erosion. As discussed further below, a layer deposited on a substrate placed anywhere below central region 52 can then be uniform in thickness and other properties (i.e., dielectric, optical index, or material concentrations). In addition, region 52 in which deposition provides uniformity of deposited film can be larger than the area in which the deposition provides a film with uniform physical or optical properties such as chemical composition or index of refraction. In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Reactive gases that provide a constant supply of ionic oxygen to keep the target surface oxidized can be provided to expand the process window. Some examples of the gases that can be utilized for controlling surface oxidation are $CO_2$, water vapor, hydrogen, $N_2O$, fluorine, helium, and cesium. Additionally, a feedback control system can be incorporated to control the oxygen partial pressure in the reactive chamber. Therefore, a wide range of oxygen flow rates can be controlled to keep a steady oxygen partial pressure in the resulting plasma. Other types of control-systems such as target voltage control and optical plasma emission control systems can also be utilized to control the surface oxidation of the target. As shown in FIG. 1A, power to target 12 can be controlled in a feedback loop at supply 14. Further, oxygen partial pressure controller 24 can control either oxygen or argon partial pressures in plasma 53.

In some embodiments, transparent conductive oxides can be deposited on various substrates utilizing an inidium-tin (In/Sn) metallic target. A series of depositions on glass in accordance with the present invention is illustrated in Table I. The parameters in the process column of Table I are in the format (pulsed DC power/RF bias power/pulsing frequency/ reverse time/deposition time/Ar flow (sccms)/$O_2$ flow (sccms)). An indium-tin (In/Sn: 90%/10% by weight) target using a reactive-pulsed DC (RPDC) process such as that described in U.S. application Ser. No. 10/101,863 was utilized. A power supply with 2 MHz RF bias applied to substrate 16 was utilized in the process. Along with the process parameters for each of the separate depositions, each defined by a "Slot" number in the first column, the target voltage, and target current ranges for each of the depositions is also listed.

Table 2 shows the results obtained by using the process parameters in Table 1. The results include the sheet resistance, thickness, bulk resistivity, and refractive indices of the resulting films. Again, the first column indicates the slot number of the deposition. The process for each slot number is reiterated in column 2 of Table 2. The sheet resistance of selected ones of the films resulting from the deposition is listed in the third column and the uniformity of the sheet resistance is indicated in the fourth column. The thickness of the film and its uniformity of each of the films deposited by the indicated process is indicated in the fifth and sixth columns. The bulk resistance of selected ones of the films, ρ, is also indicated. Additionally, the refractive index taken at 632 nm is indicated along with the film uniformity of that index. The comments section of Table 2 indicates whether the resulting film is transparent, translucent, or metallic in character.

Figure 3B:
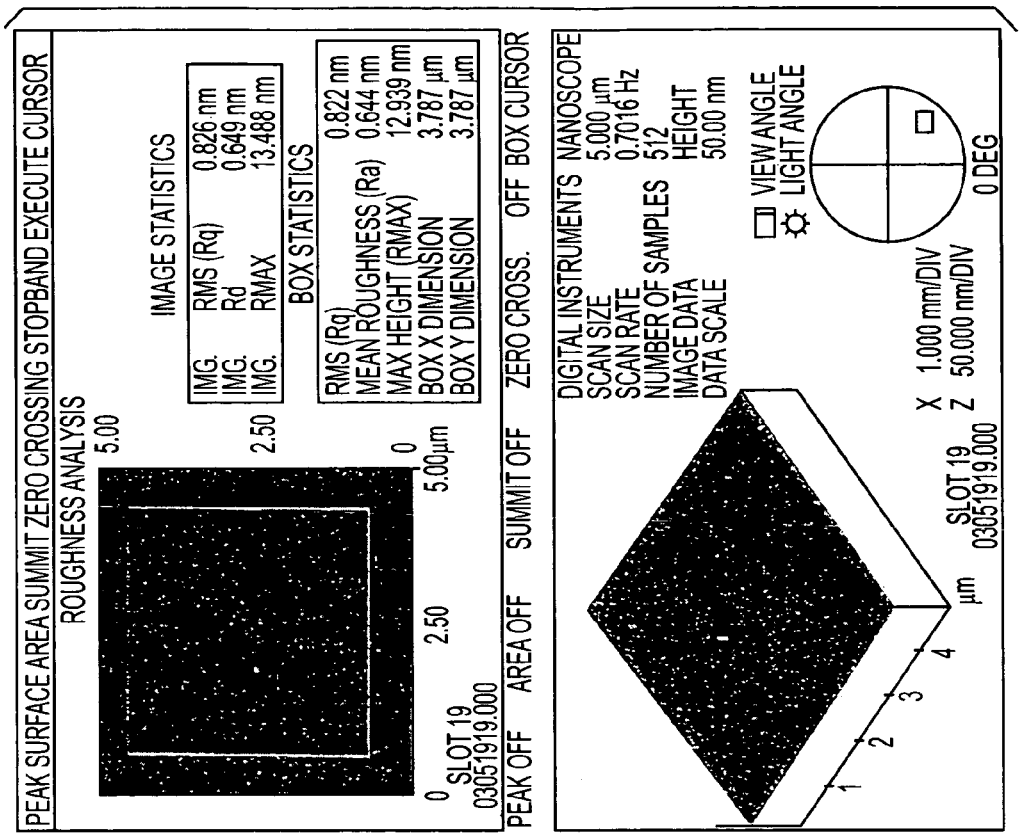
FIG. 3B shows an Atomic Force Microscopy (AFM) image of another ITO process deposited using a process according to some embodiments of the present invention.
Figure 3A:
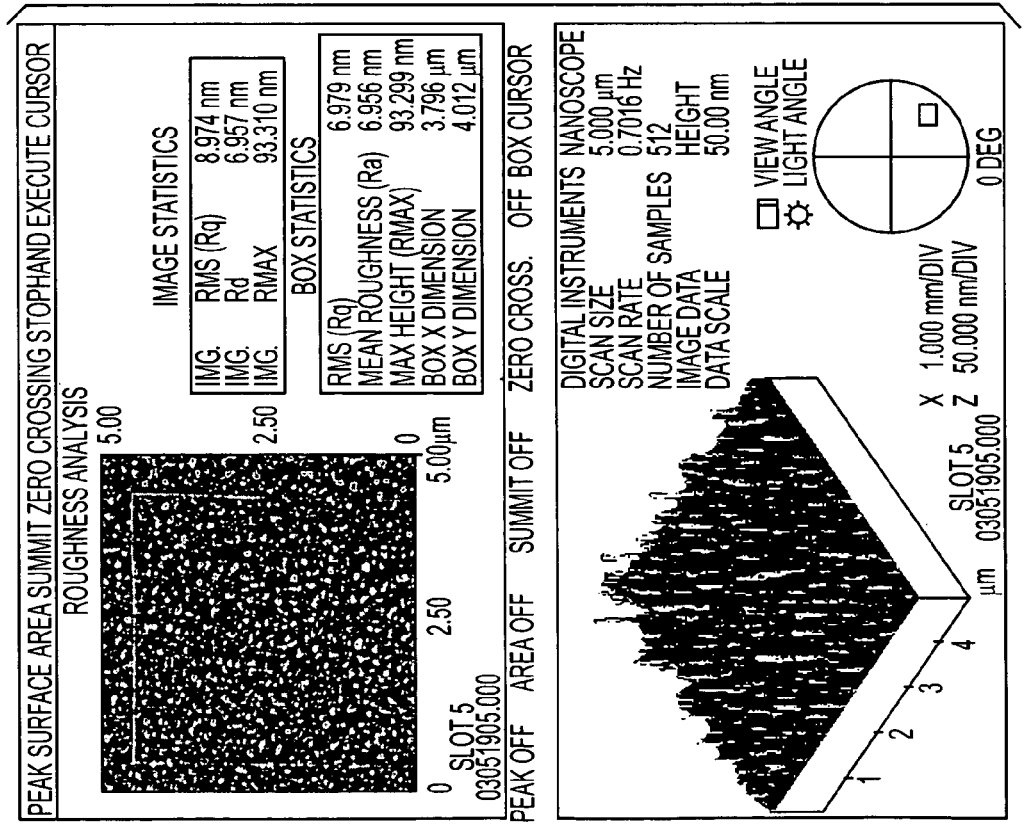
FIG. 3A shows an Atomic Force Microscopy (AFM) image of an indium-tin-oxide (ITO) process according to some embodiments of the present invention.

FIG. 3A shows the Atomic Force Microscopy (AFM) image of an ITO film produced by the process identified in slot #5 in tables 1 and 2. That process, with particularly low oxygen flow rates (24 sccm), produced a rough film with an Ra of about 70 Å and an Rms of about 90 Å. The film also appears to be metallic with this particular oxygen flow and the film roughness is high. Such a film could be applicable to large surface area requirements, for example solar cell applications. Wile not being limited by any particular theory, it is suspected that the roughness of this film reflects the substoichiometric nature of the film caused by insufficient oxygen flow in the plasma. As can be seen in FIG. 3B, where the oxygen flow during deposition has been significantly increased to about 36 sccm, the film is smooth.

FIG. 3B shows an Atomic Force Microscopy (AFM) image of an ITO film deposited using the process described in slot #19 of Tables 1 and 2. In that process, the oxygen flow rate is increased to 36 sccm. The film appears to be transparent and conductive and the surface roughness is ~6 Å Ra and Rms of about 13 Å, which is acceptable for OLED requirements. As can be seen from FIGS. 3A and 3B, variation in oxygen partial pressure (as indicated by increased flow rate) has a large influence on the characteristics of the resulting deposited film.

Figure 4:
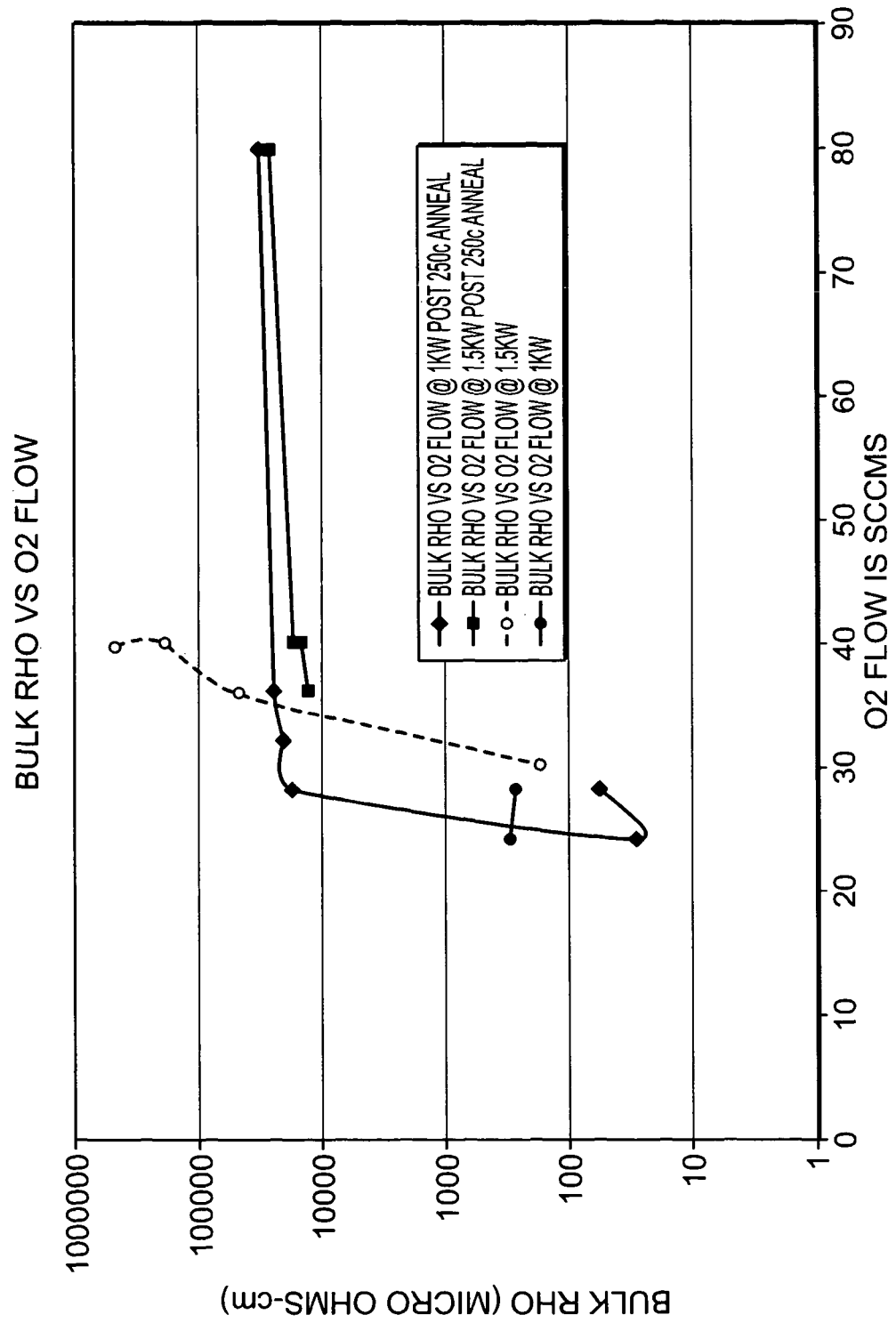
FIG. 4 shows the variation of bulk resistivity of an ITO layer according to some embodiments of the present invention as a function of the oxygen flow for two different target powers before and after a 250° C. anneal in vacuum.

The resistivity of the film layer and the smoothness of the film layer can be related. In general, the higher the resistivity of the film layer, the smoother the film layer. FIG. 4 shows the variation of bulk resistivity of the ITO as a function of the oxygen flow rate used for two different target powers before and after a 250° C. anneal in vacuum. The bulk resistivity of the film exhibits a sudden transition downward as the oxygen flow rate is lowered. This transition occurs when the target surface becomes metallic from being poisoned with oxygen. The data utilized to form the graph shown in FIG. 4 has been taken from Tables 1 and 2.

Figure 5:
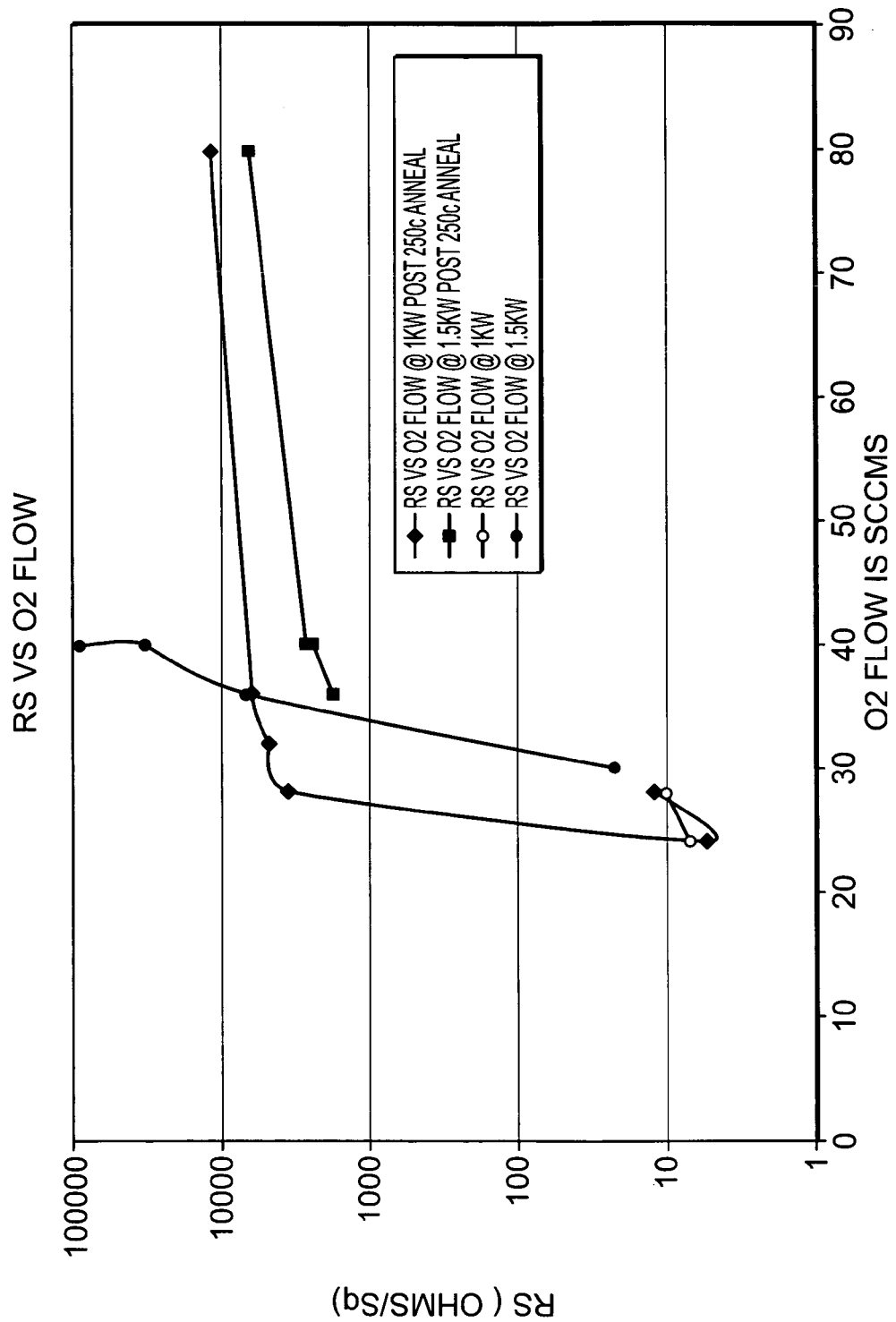
FIG. 5 shows the variation of the sheet resistance of an ITO layer according to some embodiments of the present invention as a function of the oxygen flow used for two different target powers before and after a 250° C. anneal in vacuum.

FIG. 5 shows the variation of the sheet resistance of an ITO film as function of the $O_2$ flow used for two different target powers before and after a 250 C anneal in vacuum. As shown in FIG. 5, the sheet resistance follows similar trends as the bulk resistivity of the film.

Figure 6:
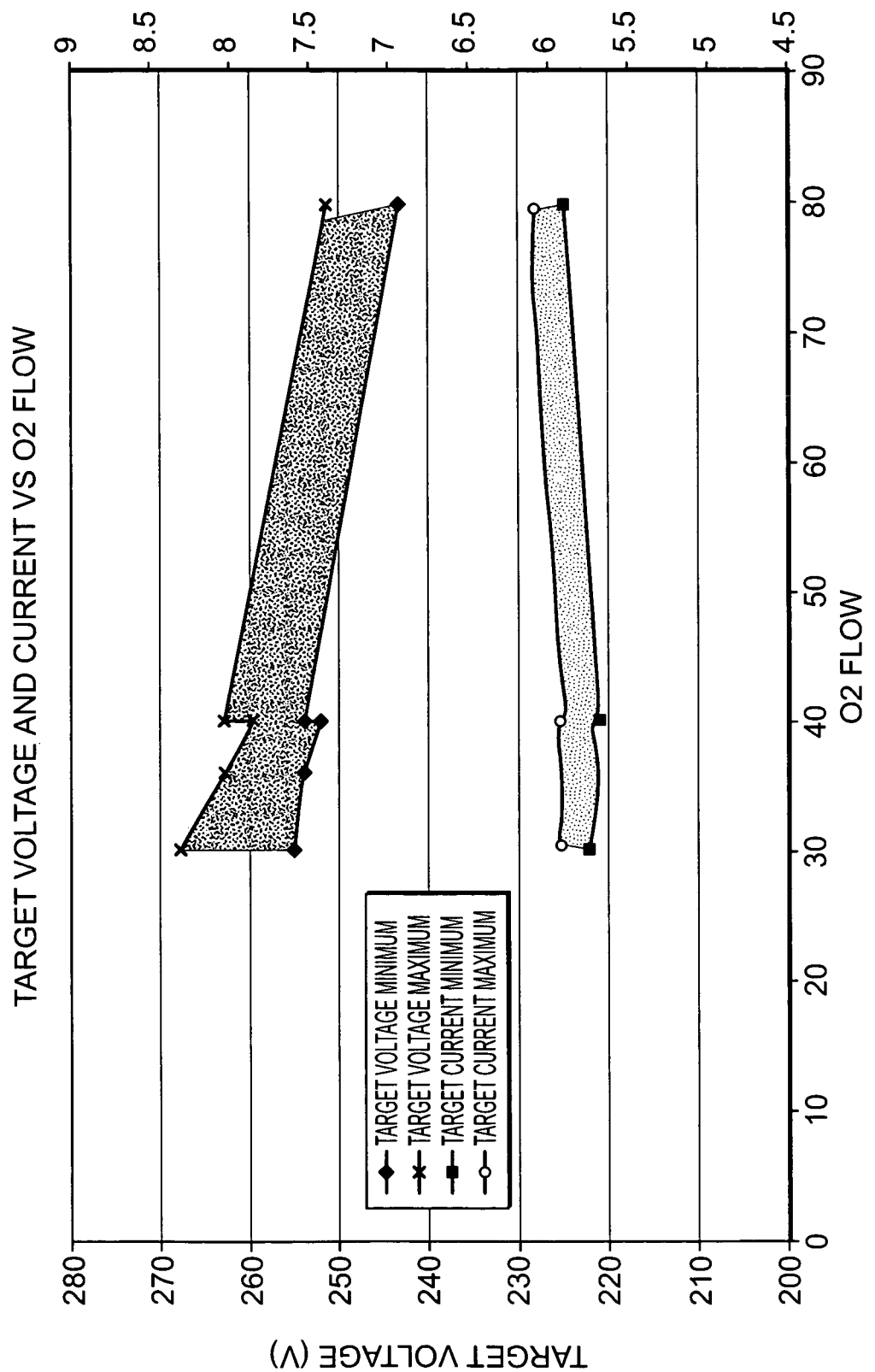
FIG. 6 shows the target current and voltage (min and max) as a function of oxygen flow.

FIG. 6 shows the target current and voltage (min and max) as a function of the oxygen flow rate. The target voltage increases as the oxygen flow rate is lowered. It could be seen here that at a 40 sccm oxygen flow rate through repeated depositions, the target voltage is not constant. This illustrates the utility of a target voltage feedback control system that adjusts the power supplied to target 12 to hold the target voltage constant. Therefore, as shown in FIG. 1A, PDC power 14 can include feedack loop to control the voltage on target 12.

Figure 7:
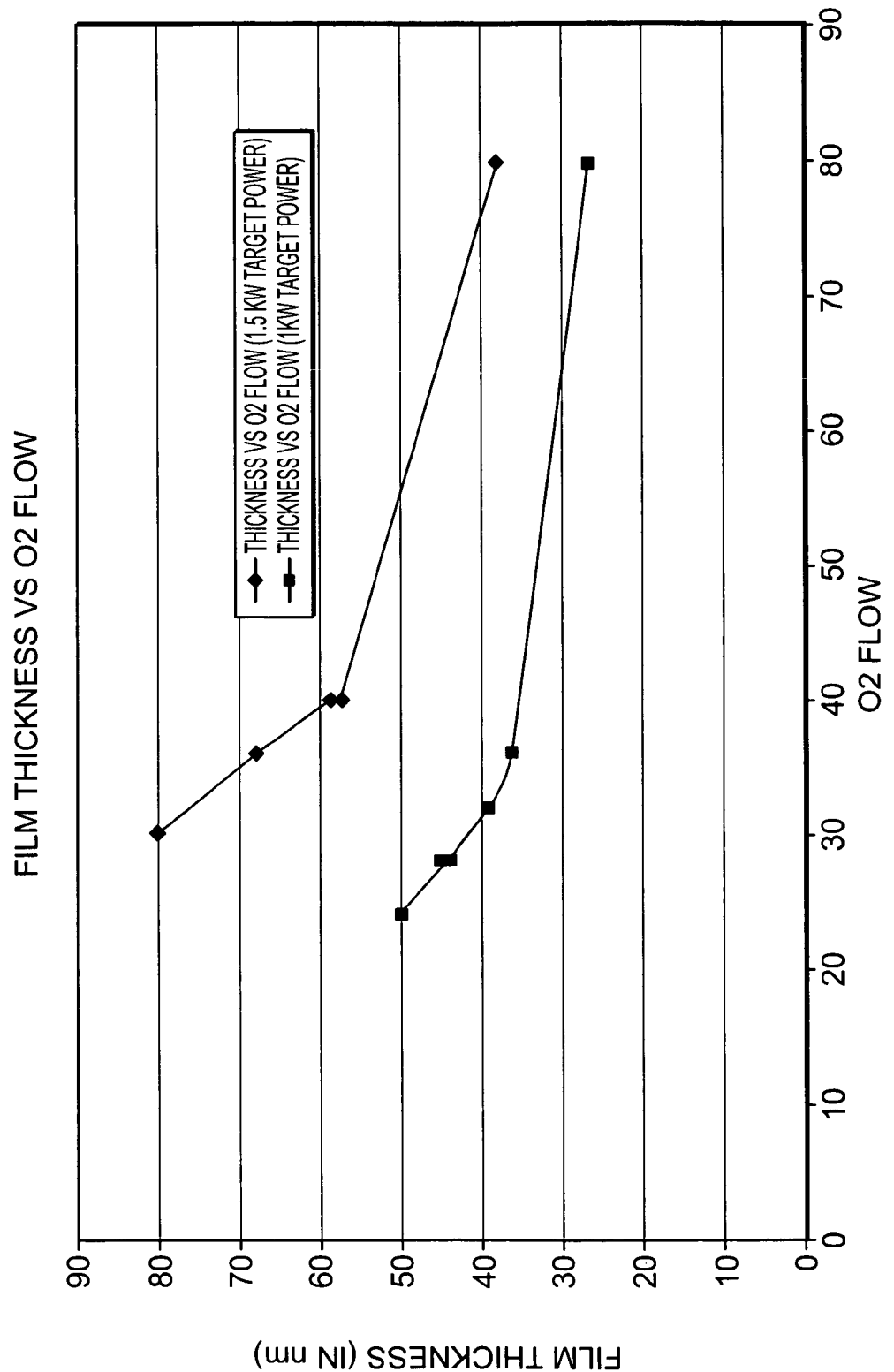
FIG. 7 shows the thickness change in layers of ITO according to embodiments of the present invention as a function of oxygen flow.

FIG. 7 shows the thickness change of a resulting film as a function of oxygen flow rate in sccm. The thickness of the film increases as the oxygen flow decreases but this could make opaque metallic films and so choosing the correct oxygen flow and utilizing an oxygen flow feedback control system to control material characteristics such as, for example, transparency or conductivity can be desirable.

Figure 8:
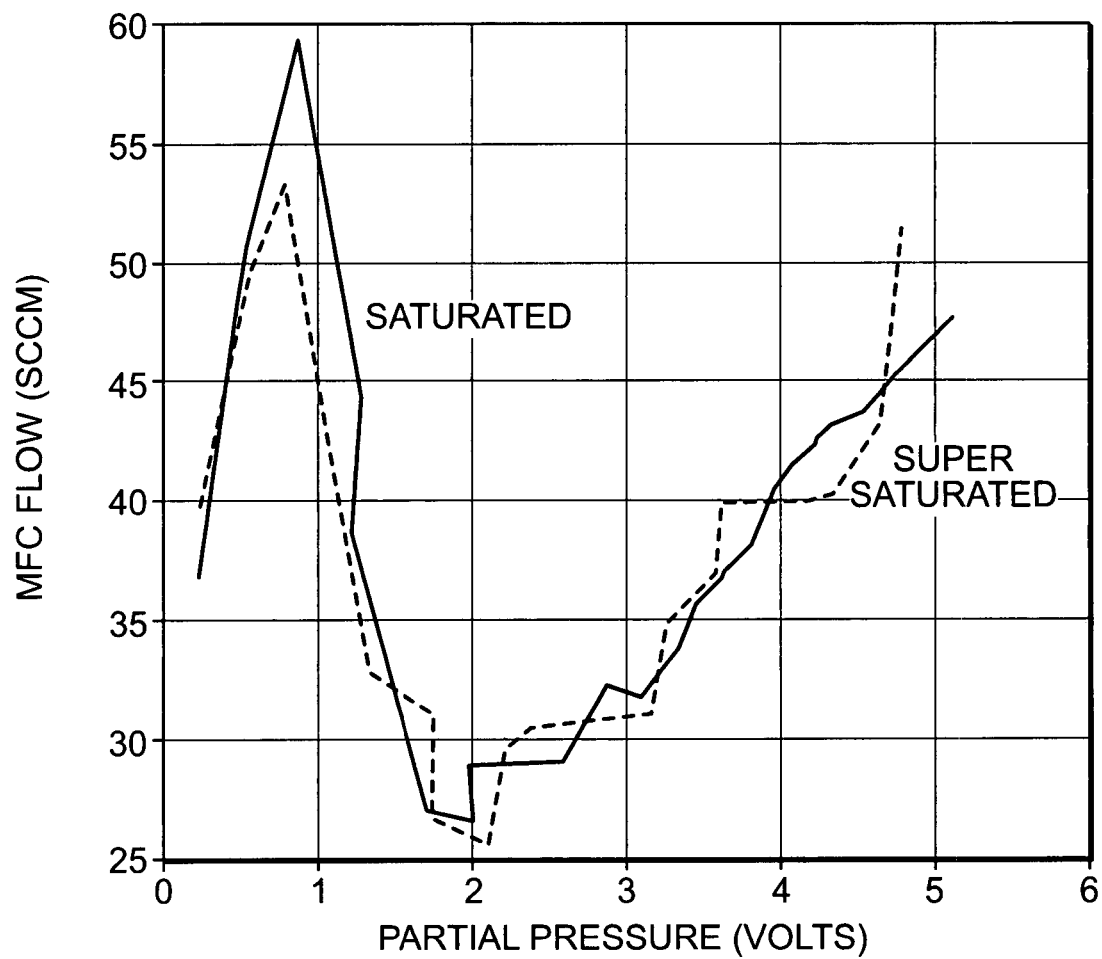
FIG. 8 illustrates the relationship between oxygen flow and oxygen partial pressure for a metallic target.

In some embodiments, instead of oxygen flow rate, oxygen partial pressure can be controlled with a feedback system 24 (see FIG. 1A). Controlling the oxygen partial pressure can provide better control over the oxygen content of the plasma, and therefore the oxygen content of the resulting films, and allows better control over the film characteristics. FIG. 8 illustrates the relationship between the flow rate and partial pressure. As can be seen from FIG. 8, in order to reach the saturated region (e.g., when target 12 is completely poisoned with oxygen), no increase in flow rate is required. In some embodiments, reactor 10 can include a partial pressure feedback loop controller 24 that controls the oxygen flow in order to maintain a desired partial pressure of oxygen in the plasma. Such a controller can be the IRESS system, that can be purchased from Advanced Energy, Inc., Ft. Collins, Colo. It has been found that film parameters such as resistivity, smoothness, and transparency can be highly dependent on oxygen partial pressures, and therefore these characteristics of the resulting deposited layer can be controlled by adjusting the oxygen partial pressures.

Figure 9B:
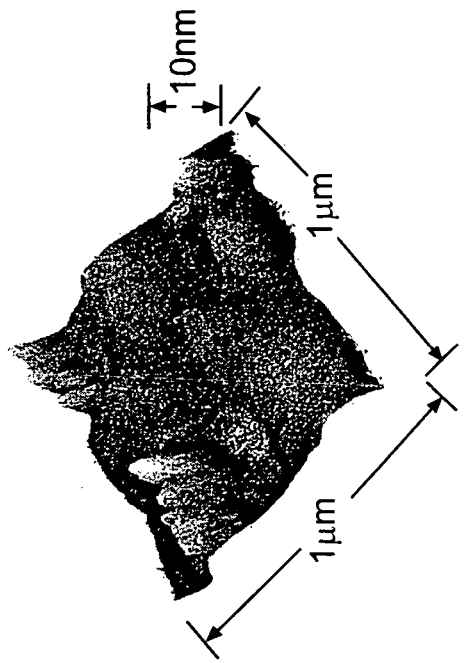
FIGS. 9A-9D illustrate the smoothness of transparent conductive oxides deposited with ceramic targets according to the present invention.
Figure 9D:
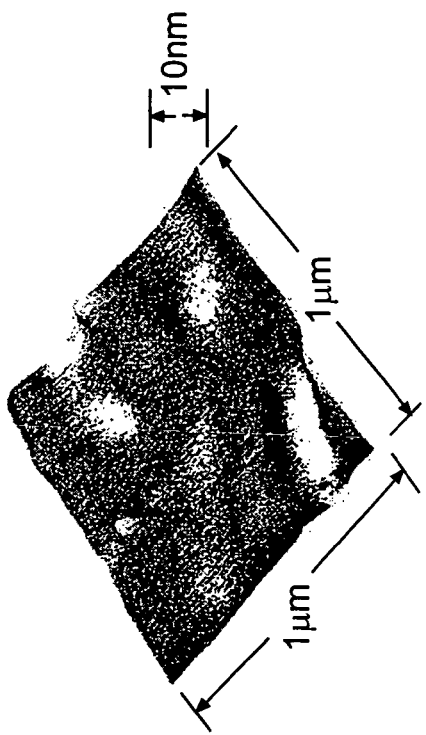
Figure 9A:
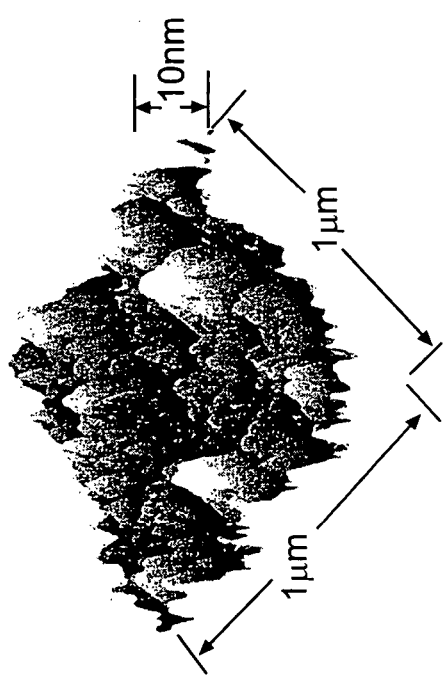
Figure 9C:
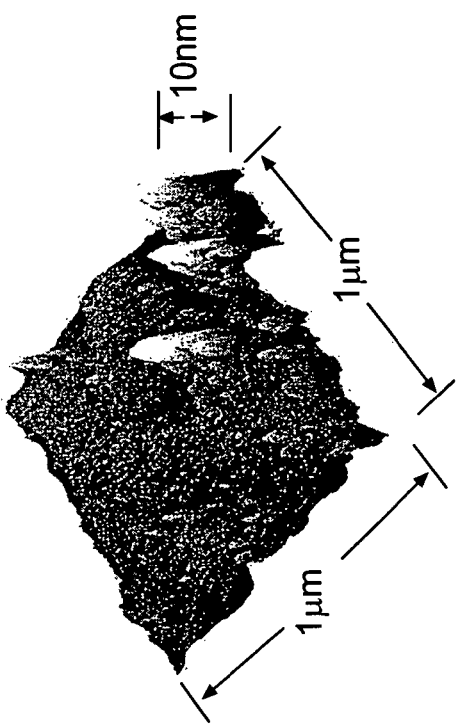

Some embodiments of the present invention can be deposited with ceramic targets. An example target is an ITO (In/Sn 90/10) ceramic target can be utilized. Table 3 illustrates some example processes for deposition of ITO utilizing a ceramic target according to the present invention. Bulk resistivity, sheet resistance, resistance, thicknesses, deposition rates, and index of refraction of the resulting films are shown along with the process parameters utilized in the deposition. FIG. 9A shows an AFM depiction of a transparent conductive oxide film corresponding to run #10 in Table 3. FIG. 9B shows an AFM depiction of a transparent conductive oxide film corresponding to run #14 in Table 3. FIG. 9C shows an AFM depiction of a transparent conductive oxide film corresponding to run #16 in Table 3. FIG. 9D shows an AFM depiction of a transparent conductive oxide film layer corresponding to run #6 in Table 3.

FIGS. 9A through 9D illustrate the roughnesses of selective depositions of ITO deposited utilizing the ceramic target. In FIG. 9A, the roughest surface shown, the film was deposited using 3 kW RF power, 100 W bias, 3 sccm $O_2$ and 60 sccm Ar at a temperature of 280° C. The layer grew to a thickness of 1200 Å in 100 seconds of deposition time and exhibited a sheet resistance of 51 ohms/sq. The roughness illustrated in FIG. 9A is characterized by an Ra=2.3 nm and $R_{MS}$ of 21 nm.

The ITO film shown in FIG. 9B was deposited using 3 kW RF power, 300 W bias, 3 sccm $O_2$ and 60 sccm Ar at a temperature of 280° C. The layer illustrated in FIG. 9B grew to a thickness of 1199 Å in 100 sec. The layer in FIG. 9B exhibited a sheet resistance of 39 ohms/sq. The roughness illustrated in FIG. 9B is characterized by an Ra=1.1 nm and Rmax of 13 nm.

The ITO film shown in FIG. 9C was deposited using 3 kW RF power, 300 W bias, 3 sccm $O_2$, 30 sccm Ar at a temperature of 280° C. The layer grew to a thickness of 1227 Å in 100 seconds of deposition time and exhibited a sheet resistance of 57 ohms/sq. The roughness illustrated in FIG. 9C can be characterized by an Ra=0.88 nm and a Rmax of 19.8 nm.

FIG. 9D was deposited using 1.5 kW RF power, 300 W bias, 0 sccm $O_2$, 30 sccm Ar at a temperature of 280 C. The layer grew to a thickness of 580 Å in 100 seconds of deposition time and exhibited a sheet resistance of 106 ohms/sq. The roughness illustrated in FIG. 9C can be characterized by an Ra=0.45 nm and an Rmax of 4.6 mm.

Utilizing the example depositions described herein, the roughness and resistivity of a transparent oxide film can be tuned to particular applications. In general, particularly high resistivities can be obtained, which are useful for touch sensitive devices. As shown in Table 3, the sheet resistance ranged from about 39 Ω/sq for trial #14 to a high of 12,284 Ω/sq for trial #1. Careful variation of the process parameters, therefore, allow control of sheet resistance over an extremely broad range. Low resistivities can be obtained by adjusting the process parameters for uses in devices such as OLEDS and MEMS display devices. As is illustrated in Table 3, the bulk resistivity can be controlled to be between about 2E-4 micro-ohms-cm to about 0.1 micro-ohms-cm. Additionally, other parameters such as refractive index and transparency of the film can be controlled.

Further, deposition of transparent conductive oxide layers, for example ITO, can be doped with rare-earth ions, for example erbium or cerium, can be utilized to form color-conversion layers and light-emission sources. In some embodiments, a rare-earth doped target can be made in a single piece to insure uniformity of doping. Co-doping can be accomplished in the target.

Similar processes for other metallic conductive oxides can also be developed. For example, deposition of zinc oxide films. Further, as can be seen in the examples shown in Table 3, low temperature depositions can be performed. For example, transparent conductive oxides according to the present invention can be deposited at temperatures as low as about 100° C. Such low temperature depositions can be important for depositions on temperature sensitive materials such as plastics.

Other thin film layers according to the present invention include deposition of other metal oxides to form conducting and semi-conducting films. Thin films formed according to the present invention can be utilized in many devices, including, but not limited to, displays, photovoltaics, photosensors, touchscreens, and EMI shielding.

Embodiments of the invention disclosed here are examples only and are not intended to be limiting. Further, one skilled in the art will recognize variations in the embodiments of the invention described herein which are intended to be included within the scope and spirit of the present disclosure. As such, the invention is limited only by the following claims.

TABLE I

| Slot # | Process | Target Voltage (V) Min | Target Voltage (V) Max | Target Current (Amps) Mix | Target Current (Amps) Max |
|---|---|---|---|---|---|
| 14 | 1.5 kw/100 w/200 khz/2.2 μs/ 300 s/20Ar/80O$_2$ | 244 | 252 | 5.94 | 6.14 |
| 15 | 1.5 kw/100 w/200 khz/2.2 μs/ 300 s/20Ar/40O$_2$ | 254 | 263 | 5.7 | 5.9 |
| 17 | 1.5 kw/100 w/200 khz/2.2 μs/ 300 s/20Ar/40O$_2$ | 252 | 260 | 5.76 | 5.96 |
| 19 | 1.5 kw/100 w/200 khz/2.2 μs/ 300 s/20Ar/36O$_2$ | 254 | 263 | 5.72 | 5.92 |
| 21 | 1.5 kw/100 w/200 khz/2.2 μs/ 300 s/20Ar/30O$_2$ | 255 | 268 | 5.76 | 5.9 |
| 1 | 1 kw/100 w/200 khz/2.2 μs/ 300 s/20Ar/80O$_2$ | 224 | 233 | 4.32 | 4.5 |
| 2 | 1 kw/100 w/200 khz/2.2 μs/ 300 s/20Ar/36O$_2$ | 231 | 243 | 4.12 | 4.3 |
| 3 | 1 kw/100 w/200 khz/2.2 μs/ 300 s/20Ar/32O$_2$ | 232 | 242 | 4.12 | 4.28 |

TABLE I-continued

| Slot # | Process | Target Voltage (V) Min | Target Voltage (V) Max | Target Current (Amps) Mix | Target Current (Amps) Max |
|---|---|---|---|---|---|
| 4 | 1 kw/100 w/200 khz/2.2 µs/300 s/20Ar/28O$_2$ | 237 | 243 | 4.1 | 4.22 |
| 5 | 1 kw/100 w/200 khz/2.2 µs/300 s/20Ar/24O$_2$ | 233 | 243 | 4.1 | 4.34 |
| 6 | 1 kw/100 w/200 khz/2.2 µs/300 s/20Ar/28O$_2$ | 231 | 245 | 4.12 | 4.3 |

TABLE II

| Slot # | Process | Rs (Ohms/Sq) | Rs unif % | Th (nm) | Th std 1 sig | Bulk Rho (µOhm-cm) | R.I (@632 nm) | R.I Unif (%) | Comments |
|---|---|---|---|---|---|---|---|---|---|
| 14 | 1.5 kw/100 w/200 khz/2.2 µs/300 s/20Ar/80O2 | | | 38.59 | 0.16 | | 1.980758 | 0.000005 | transparent |
| 15 | 1.5 kw/100 w/200 khz/2.2 µs/300 s/20Ar/40O2 | 94112 | 2 | 57.28 | 0.51 | 539073.5 | 1.951452 | 0.029342 | translucent |
| 17 | 1.5 kw/100 w/200 khz/2.2 µs/300 s/20Ar/40O2 | 33927 | 60.282 | 58.48 | 1.37 | 198405.1 | 1.936166 | 0.040957 | translucent |
| 19 | 1.5 kw/100 w/200 khz/2.2 µs/300 s/20Ar/36O2 | 7335.32 | 72.49 | 67.75 | 1.03 | 49696.8 | 1.980746 | 0.000018 | translucent |
| 21 | 1.5 kw/100 w/200 khz/2.2 µs/300 s/20Ar/30O2 | 22.3507 | 2.995 | 80 | | 178.8 | | | metallic |
| 1 | 1 kw/100 w/200 khz/2.2 µs/300 s/20Ar/80O2 | | | 26.69 | 0.32 | | 1.980326 | 0.00096 | transparent |
| 2 | 1 kw/100 w/200 khz/2.2 µs/300 s/20Ar/36O2 | | | 36.4 | 0.13 | | 1.980756 | 0.000003 | transparent |
| 3 | 1 kw/100 w/200 khz/2.2 µs/300 s/20Ar/32O2 | | | 39.3 | 0.15 | | 1.980761 | 0 | transparent |
| 4 | 1 kw/100 w/200 khz/2.2 µs/300 s/20Ar/28O2 | | | 44.02 | 0.24 | | 1.98076 | 0.000001 | transparent |
| 5 | 1 kw/100 w/200 khz/2.2 µs/300 s/20Ar/24O2 | 58.1031 | 7.467 | 50 | | 290.5 | | | metallic |
| 6 | 1 kw/100 w/200 khz/2.2 µs/300 s/20Ar/28O2 | 58.0992 | 10.566 | 45 | | 261.4 | | | metallic |

TABLE III

| Trial | Run (sec) | Target Power (kW) | Bias/W | O2 | Ar | T (°C.) | Rs (Ohms/Sq) | Rs (non-unif) | Bulk Rho (uOhmcm) | Thickness (Å) | n | DepRate (A/sec) | Target/V | Target/I |
|---|---|---|---|---|---|---|---|---|---|---|---|---|---|---|
| 14 | 100 | 3 | 300 | 3 | 60 | 280 | 38.69 | 4.07% | 4.64E−04 | 1200 | 1.864 | 12 | | |
| 16 | 100 | 3 | 300 | 3 | 30 | 280 | 56.90 | 7.94% | 6.98E−04 | 1227 | 1.888 | 12.27 | 288-308 | 9.86-10.42 |
| 10 | 100 | 3 | 100 | 3 | 60 | 280 | 50.98 | 11.89% | 6.25E−04 | 1225 | 1.933 | 12.25 | 265-275 | 10.92-11.36 |
| 4 | 100 | 1.5 | 100 | 3 | 30 | 280 | 383.62 | 21.72% | 2.09E−03 | 543.9 | 2.016 | 5.439 | 238-251 | 5.98-6.32 |
| 8 | 100 | 1.5 | 300 | 3 | 30 | 280 | 504.02 | 7.23% | 2.44E−03 | 483.5 | 2.082 | 4.835 | 239-250 | 5.98-6.33 |
| 2 | 100 | 1.5 | 100 | 3 | 30 | 280 | 402.52 | 26.80% | 2.10E−03 | 520.7 | 2.056 | 5.207 | 225-239 | 6.46-6.68 |
| 6 | 100 | 1.5 | 300 | 0 | 60 | 280 | 106.21 | 6.12% | 6.17E−04 | 580.5 | 1.945 | 5.805 | 237-250 | 5.98-6.38 |
| 12 | 100 | 3 | 100 | 4 | 30 | 280 | 374.34 | 19.43% | 4.18E−03 | 1116 | 1.917 | 11.16 | 285-300 | 9.98-10.52 |
| 15 | 100 | 3 | 300 | 4 | 30 | 100 | 6264.69 | 58.18% | 6.81E−02 | 1087 | 1.897 | 10.87 | 282-304 | 10.00-10.62 |
| 7 | 100 | 1.5 | 200 | 4 | 30 | 100 | 7509.45 | 44.14% | 2.95E−02 | 392.3 | 2.149 | 3.923 | 237-250 | 6.02-632 |
| 1 | 100 | 1.5 | 100 | 4 | 30 | 100 | 12284.82 | 112.55% | 4.78E−02 | 389.1 | 2.236 | 3.891 | 238-250 | 6.04-632 |
| 11 | 100 | 3 | 100 | 3 | 60 | 100 | 631.77 | 49.40% | 7.30E−03 | 1155 | 1.958 | 11.55 | 266-273 | 10.96-11.38 |
| 9 | 100 | 3 | 100 | 0 | 30 | 100 | 43.78 | 7.47% | 5.55E−04 | 1268 | 1.945 | 12.68 | 288-307 | 9.78-10.42 |
| 5 | 100 | 1.5 | 200 | 3 | 60 | 100 | 1293.53 | 14.82% | 5.88E−03 | 454.8 | 2.149 | 4.548 | 225-235 | 6.46-6.68 |
| 3 | 100 | 1.5 | 100 | 4 | 60 | 100 | 4154.43 | 28.25% | 1.78E−02 | 428.8 | 2.211 | 4.288 | 226-235 | 6.44-6.64 |
| 13 | 100 | 3 | 200 | 0 | 60 | 100 | 49.05 | 7.24% | 6.16E−04 | 1256 | 1.913 | 12.56 | 264-275 | 10.96-11.38 |
| 18 | 100 | 2.25 | 100 | 3 | 30 | 100 | 1476.79 | 21.54% | 1.10E−02 | 744.5 | 2.044 | 7.445 | 263-277 | 8.08-8.56 |
| 17 | 100 | 1.5 | 150 | 0 | 60 | 100 | 157.23 | 8.83% | 9.91E−04 | 630.5 | 1.931 | 6.305 | 225-231 | 6.48-6.74 |
| 19 | 100 | 2.25 | 150 | 3 | 60 | 100 | 526.72 | 13.01% | 4.29E−03 | 814.2 | 2.021 | 8.142 | 247-255 | 8.78-9.14 |

We claim:

1. A method of forming a transparent conductive oxide film on a substrate, comprising:
   supplying a target;
   depositing on the substrate the transparent conductive oxide film in a pulsed DC reactive ion process with an RF substrate bias at an RF frequency, wherein the target receives alternating negative and positive voltages from a pulsed DC power supply through narrow band rejection filter, the narrow band rejection filter rejecting frequencies in a narrow band around the RF frequency while passing frequencies both above and below that narrow band; and
   controlling at least one process parameter to provide at least one characteristic of the conductive oxide film at a particular value.

2. The method of claim 1, wherein controlling at least one process parameter includes controlling an oxygen partial pressure.

3. The method of claim 1, wherein the transparent conductive oxide film includes indiuim-tin oxide.

4. The method of claim 1, wherein the at least one characteristic includes sheet resistance.

5. The method of claim 1, wherein the at least one characteristic includes film roughness.

6. The method of claim 5, wherein the transparent conductive oxide film includes an indium-tin oxide film and the film roughness is characterized by $R_a$ less than about 10 nm with Rms of less than about 20 nm.

7. The method of claim 4, wherein the bulk resistance can be varied between about $2\times10^{-4}$ micro-ohms-cm to about 0.1 micro-ohms-cm.

8. The method of claim 1, wherein the at least one process parameter includes a power supplied to a target.

9. The method of claim 1, wherein the at least one process parameter includes an oxygen partial pressure.

10. The method of claim 1, wherein the at least one process parameter includes bias power.

11. The method of claim 1, wherein the at least one process parameter includes deposition temperature.

12. The method of claim 1, wherein the at least one process parameter includes an argon partial pressure.

13. The method of claim 1, further including supplying a metallic target.

14. The method of claim 1, further including supplying a ceramic target.

15. The method of claim 1, wherein the transparent conductive oxide film is doped with at least one rare-earth ions.

16. The method of claim 15, wherein the at least one rare-earth ions includes erbium.

17. The method of claim 15, wherein the at least one rare-earth ions includes cerium.

18. The method of claim 1 wherein the narrow band is about 100 kHz and the RF frequency of the RF bias is about 2 MHz.

19. A method of depositing a transparent conductive oxide film on a substrate, comprising:
   placing the substrate in a reaction chamber;
   providing pulsed DC power to a target in the reaction chamber through a narrow band rejection filter that rejects frequencies in a narrow band around an RF frequency while passing frequencies both above and below the narrow band such that the voltage on the target alternates between positive and negative voltages;
   providing, to the substrate, an RF bias at the RF frequency;
   adjusting gas flow into the reaction chamber; and
   providing a magnetic field at the target in order to direct deposition of the transparent conductive oxide film on the substrate in a pulsed-dc biased reactive-ion deposition process, wherein the transparent conductive oxide film exhibits at least one particular property.

20. The method of claim 19, wherein at least one particular property of the transparent conductive oxide film is determined by parameters of the pulsed-dc biased reactive ion deposition process.

21. The method of claim 20, wherein the at least one particular property includes resistivity of the transparent conductive oxide film.

22. The method of claim 20, wherein the transparent conductive oxide film includes an indium-tin oxide film.

23. The method of claim 20, wherein the parameters include oxygen partial pressure.

24. The method of claim 20, wherein the parameters include bias power.

25. The method of claim 19, wherein the target can include at least one rare-earth ions.

26. The method of claim 25, wherein the at least one rare-earth ions includes erbium.

27. The method of claim 25, wherein the at least one rare-earth ion includes cerbium.

28. The method of claim 18 wherein the narrow band is about 100 kHz and the RF frequency of the RF bias is about 2 MHz.

* * * * *